(12) United States Patent
Fukuzawa et al.

(10) Patent No.: US 7,212,713 B2
(45) Date of Patent: May 1, 2007

(54) OPTICAL TRANSMISSION SUBSTRATE, METHOD FOR MANUFACTURING OPTICAL TRANSMISSION SUBSTRATE AND OPTOELECTRONIC INTEGRATED CIRCUIT

(75) Inventors: Tadashi Fukuzawa, Tokyo-to (JP); Masaki Hasegawa, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 10/977,170

(22) Filed: Oct. 29, 2004

(65) Prior Publication Data
US 2005/0117833 A1    Jun. 2, 2005

(30) Foreign Application Priority Data
Nov. 27, 2003 (JP) ............... 2003-397920

(51) Int. Cl.
G02B 6/26 (2006.01)
G02B 6/42 (2006.01)
G02B 6/12 (2006.01)
G02B 6/38 (2006.01)
G02B 6/36 (2006.01)

(52) U.S. Cl. .................... 385/50; 385/14; 385/15; 385/24; 385/39; 385/53; 385/70; 385/71; 385/88; 385/89; 385/129; 385/132

(58) Field of Classification Search ............ 385/14, 385/15, 24, 39, 50, 53, 70, 71, 88, 89, 129, 385/132
See application file for complete search history.

(56) References Cited
U.S. PATENT DOCUMENTS
5,125,054 A * 6/1992 Ackley et al. ........... 385/49

6,330,377 B1 * 12/2001 Kosemura .................... 385/14

(Continued)

FOREIGN PATENT DOCUMENTS
JP    11-119033    4/1999

(Continued)

OTHER PUBLICATIONS

Cregan et al., "Single Mode Photonic Band Gap Guidance of Light in Air", Science, vol. 285, Sep. 3, 1999, pp. 1537-1539.

(Continued)

Primary Examiner—Frank G. Font
Assistant Examiner—Derek L. Dupuis
(74) Attorney, Agent, or Firm—Gibb I.P. Law Firm, LLC; Daniel Johnson, Esq.

(57) ABSTRACT

Provided is an optical transmission substrate including: a first substrate; an optical waveguide which has clad covering a core and a periphery of the core and extends on an upper surface of the first substrate; a second substrate provided parallel to the first substrate so that a lower surface thereof contacts an upper surface of the optical waveguide; a reflection surface which is provided on a cross section of the core at an end of the optical waveguide and reflects light, which travels through the core of the optical waveguide, toward the second substrate; and a light guide which is provided in the second substrate and guides the light, which is reflected toward the second substrate, toward an upper surface of the second substrate from a position closer to the core than an upper surface of the clad.

15 Claims, 12 Drawing Sheets

U.S. PATENT DOCUMENTS

| | | | |
|---|---|---|---|
| 6,847,765 B2 * | 1/2005 | Nishimura | 385/50 |
| 2002/0051599 A1 * | 5/2002 | Tsukamoto et al. | 385/14 |
| 2002/0097962 A1 * | 7/2002 | Yoshimura et al. | 385/50 |
| 2005/0175273 A1 * | 8/2005 | Iida et al. | 385/15 |
| 2006/0008199 A1 * | 1/2006 | Glebov et al. | 385/15 |
| 2006/0210213 A1 * | 9/2006 | Huang et al. | 385/14 |

FOREIGN PATENT DOCUMENTS

| | | |
|---|---|---|
| JP | 11-119034 | 4/1999 |
| JP | 2000-47044 | 2/2000 |
| JP | 2000-081524 | 3/2000 |
| JP | 2000-227524 | 8/2000 |
| JP | 2000-235127 | 8/2000 |

OTHER PUBLICATIONS

T. Maruno, "Polymer Optical Waveguide Devices", Technical Report of IEICE, 1999, pp. 1-6.

Ishii et al., "Large-Tolerant OptoBump Interface For Interchip Optical Interconnections" vol. J84-C, No. 9, 2001, pp. 793-799. (No English Translation).

Mikami et al., "Development of Optical Surface Mount Technology", vol. J84-C, No. 9, 2001, pp. 715-726. (No English Translation).

Offrein et al., "Tunable WDM Add/Drop Components in Silicon-Oxynitride Waveguide Technology", Electronic Components and Technology Conference, 1999, pp. 19-25.

* cited by examiner

OPTICAL TRANSMISSION SUBSTRATE, METHOD FOR MANUFACTURING OPTICAL TRANSMISSION SUBSTRATE AND OPTOELECTRONIC INTEGRATED CIRCUIT

BACKGROUND OF THE INVENTION

The present invention relates to an optical transmission substrate, a method for manufacturing an optical transmission substrate and an optoelectronic integrated circuit. Particularly, the present invention relates to an optical transmission substrate including an optical waveguide therein, a method for manufacturing an optical transmission substrate and an optoelectronic integrated circuit.

The technological innovations over the years are reaching a territory where computer performance is subjected to rate-controlling depending on how fast data transfer to/from other elements is performed and not on improvement in a switching speed of a semiconductor element or an operating clock. Thus, connection within a board or between boards by use of a terabit-class ultra-high speed, large-capacity interconnect has been required. Along with the above requirement, it has been more and more difficult to realize sufficient performance of even interconnect within the board by use of electric interconnect.

On the other hand, optical interconnect has a characteristic that the optical interconnect can perform ultra-high speed transmission exceeding 10 Gb/s by direct modulation of a laser and has a small space occupied volume per channel. Thus, it has been expected that interconnect in a short transmission distance of about several 10 cm may also have a sufficient advantage over the electric interconnect. However, a high-performance mounting board, in which the electric interconnect and the optical interconnect are mixed by use of a possible method as an industrialization process, has not yet been realized. Thus, urgent development has been expected.

As a method for providing optical interconnect on a mounting substrate, the following technologies have been disclosed.

(1) Method by Installing Optical Fibers

A method for installing optical fibers on a mounting substrate by using an electric wiring installation machine and a one-stroke drawing technique is disclosed (patent documents 1 and 2).

(2) Method by Using Optical Waveguide

An optical waveguide can be formed by high-precision processing utilizing a semiconductor process such as spin coating and photolithography. Thus, the optical waveguide may be realized at low cost. Consequently, research and development of optical waveguides by use of various materials have been conducted.

A quartz optical waveguide is excellent in heat resistance with few loss of light absorption and has been put to practical use as an optical demultiplexer, an add/drop selector or the like in a backbone optical communication field using single-mode transmission (nonpatent document 1).

An optical waveguide by use of an organic polymer material can be formed by spin coating a film of the organic polymer material with a sufficient thickness. Moreover, photolithography can be utilized for pattern formation. Thus, there is an advantage that mounting substrates can be mass-produced at a low price.

Patent document 3 discloses a method for connecting an optical waveguide with an optical element in the case of using the optical waveguide in optical interconnect. According to this document, in order to allow light guided by an optical waveguide provided parallel to a substrate to enter into an optical element by bending the light in a vertical direction of the substrate, a surface tilted at 45 degrees to the optical waveguide is formed by cutting a core part of the optical waveguide at an end of the optical waveguide. Accordingly, after applying metal on this surface to obtain a reflection surface, clad is formed in a portion in the vicinity of the reflection surface, the portion being cut to form the reflection surface, and above the core part of the optical waveguide. Subsequently, a light receiving element is provided on an upper surface of the clad.

Patent document 4 discloses a method for connecting an optical element and an optical waveguide with each other in such a manner that the optical element is provided in an upper surface of a mounting substrate, the optical waveguide is provided in a lower surface of the mounting substrate and a through-hole is made to have an optical waveguide function, in order to eliminate instability in mounting the optical element directly on the optical waveguide. Besides the above-described method, a method using a structure in which an optical waveguide is exposed to one of an edge of a mounting substrate is disclosed in patent documents 5 and 6.

When the optical waveguide is provided on the surface of the mounting substrate, the optical waveguide is damaged in mounting electronic components or optical components and a difference in thermal expansion coefficient between the mounting substrate and an optical waveguide material causes the mounting substrate to bend. Accordingly, the optical waveguide is damaged and an optical coupling efficiency between the optical components and the optical waveguide is lowered. Thus, a method for resolving the problem described above by burying the optical waveguide in the mounting substrate has been studied.

Nonpatent document 1 discloses a method for connecting an optical waveguide and an electronic circuit with each other by use of an optical guide pin, which is forming the optical waveguide bent at 90 degrees. More specifically, a round through-hole is made in the optical waveguide and an optical guide pin formed of a step-index multimode optical fiber with a core diameter of 50 micrometers, which is previously polished at an angle of 45 degrees, is inserted into the through-hole. Here, the optical waveguide adopts a structure in which a periphery of a core of a 40×40 μm square is covered with clad.

Nonpatent document 2 discloses a method for optically coupling signal light to a surface-mounted optical device in such a manner that light is bent at 90 degrees by use of a 45-degree mirror formed at an end of an optical waveguide sandwiched between printed circuit boards, the signal light is extracted in a vertical direction from the printed circuit boards and the signal light is converged by a lens.

Nonpatent document 3 discloses an optical transmitter receiver module mounting a polymer optical waveguide on an electronic circuit.

(Patent Document 1)Japanese Patent Laid-Open No. Hei 11 (1999)-119033

(Patent Document 2)Japanese Patent Laid-Open No. Hei 11 (1999)-119034

(Patent Document 3)Japanese Patent Laid-Open No. 2000-47044

(Patent Document 4)Japanese Patent Laid-Open No. 2000-81524

(Patent Document 5)Japanese Patent Laid-Open No. 2000-227524

(Patent Document 6)Japanese Patent Laid-Open No. 2000-235127

(Nonpatent Document 1)B. J. Offrein et. al., "Tunable WDM Add/Drop Components in Silicon Oxynitride Waveguide Technology", 49$^{th}$ Electronic Components & Technology Conference 1999 Proceedings, p. 19–25

(Nonpatent Document 2)Mikami, Uchida, "Development in Optical Surface-Mount Technology", IEICE (Institute of Electronics, Information and Communication Engineers) Transactions C Vol. J84-C, p. 715–726, 2001

(Nonpatent Document 3)Ishii, Arai, "Wide Tolerance 'Optical Bump' Interface for Chip-Level Optical Interconnection", IEICE (Institute of Electronics, Information and Communication Engineers) Transactions C Vol. J84-C, p. 793–799, 2001

(Nonpatent Document 4)Maruno, "Polymer Optical Waveguide Device", IEICE (Institute of Electronics, Information and Communication Engineers) Transactions C Vol. J84-C, p. 1–6, 2001

(Nonpatent Document 5)R. F. Cregan et. al., "Single-Mode Photonic Band Gap Guidance of Light in Air", Science, Vol. 285, p. 1537–1539, 1999

In the method of patent documents 1 and 2, it takes time to sequentially install the optical fibers and it is difficult to mechanize a method for forming an input/output portion of light to the optical fibers. Thus, the method is not suitable for mass production. In addition, the input/output portion of the optical fiber is mechanically weak and easily damaged. Moreover, it takes effort to exchange the optical fibers when damaged. Furthermore, it is impossible to perform wiring by use of, for example, a radius of curvature (for example, about 20 mm or less) which is smaller than the least curvature of the optical fiber. Consequently, application to a high-density optical/electric mounting board is difficult.

Moreover, in the method of nonpatent document 1, it is required to perform sputtering or the like for attaching films and etching an optical waveguide structure. In addition, large-sized vacuum equipment is required in the conventional manufacturing method. Thus, this method is not suitable as a method for forming an optical waveguide in a large mounting board. Moreover, there is a problem that it is difficult to thicken the optical waveguide structure by sputtering or the like in order to form a 50×50 μm square multimode optical waveguide which is easily subjected to optical coupling.

Moreover, in the method of patent document 3, the clad is interposed between the core part and the reflection surface and between the reflection surface and the light receiving element. Thus, light emitted from the optical waveguide is diffused and irradiated on the light receiving element. Moreover, light of a light emitting element is optically coupled without special focusing optics or guiding optics. Thus, it is difficult to couple light of the optical waveguide to the optical element through a thick mounting substrate. Moreover, the optical waveguide and the optical element are exposed to the surface of the mounting substrate. Thus, there is a problem that it is highly likely that the optical waveguide and the optical element are damaged by mechanical, thermal and chemical processing in a laminate process, a built-up process and the like for an electronic circuit, which should be performed after formation of the optical waveguide.

Furthermore, in the method of patent document 4, in the case of performing a process of forming the optical waveguide after mounting an electronic device, there is a possibility that the electronic devices are damaged. Meanwhile, in the case of mounting the electronic device after forming the optical waveguide, there is a possibility that the optical waveguide exposed to a lower surface of the mounting substrate is damaged. Moreover, in the methods of patent documents 4, 5 and 6, the optical waveguide portion and the mounting substrate have asymmetric structures. Thus, there is a possibility that the optical waveguide is damaged by warp in the mounting substrate caused by temperature rise in the middle of a manufacturing process of the mounting substrate, temperature rise within a case in operation of the electronic device and the like.

In the method of nonpatent document 2, a core of an optical waveguide and a core of an optical fiber are connected to each other through clad of the optical fiber. Thus, compared to the case of connecting the both cores directly to each other, light is diffused and coupling loss occurs. Moreover, the optical waveguide and a optical guide pin have different core diameters from each other. Thus, compared to the case of connecting a thinner one with a thicker one, in an opposite case, there is a possibility that the loss is increased by about 10% and the coupling efficiency is reduced to 50% or less. Moreover, it is required to reduce a diameter of an optical detector in order to perform high-speed optical transmission. Thus, the coupling loss is increased.

In addition, in making a through-hole, the end of the optical waveguide is processed. Thus, there is a possibility that an optical output portion is damaged by chips including chips of electrodes or the like. As a result, light scatters in the optical output portion and the coupling efficiency is further lowered.

Moreover, in order to provide both of the optical interconnect and the electric interconnect, the mounting substrate mounting the optical waveguide adopts a structure in which upper and lower sides of the optical waveguide are sandwiched by printed circuit boards. Thus, it is difficult to align a cross-section portion of a tip of an optical guide pin with a height of a core portion of the optical waveguide. Furthermore, the printed circuit board has a large thermal expansion coefficient in its thickness direction. Accordingly, a position of the optical guide pin is shifted by a temperature change. Thus, the coupling loss is increased.

As described above, in the method for aligning the cross-section portion of the tip of the optical guide pin with the height of the core portion of the optical waveguide by making the through-hole and inserting the optical guide pin into the through-hole thereabove, the alignment is difficult and the coupling loss occurs. Thus, it is difficult to realize a high-performance optical/electric mounting substrate.

Moreover, in the method of nonpatent document 3, it is difficult to realize a sufficient coupling efficiency in the case where light is focused in a thickness direction of a thick mounting substrate by use of a lens relay system and the light is received by a photodetector. Particularly, in the case of realizing ultra-high-speed transmission, it is required to reduce a diameter of the photodetector. Thus, light focusing by use of the lens relay system becomes extremely difficult.

Moreover, in the method of nonpatent document 4, in the formation of an optical/electric mounting substrate by mounting a polymer optical waveguide on an electronic circuit, the exposed optical waveguide is damaged in mounting electronic components. Moreover, deterioration and warp are caused by heat. Thus, it is difficult to realize a high-performance mounting substrate.

SUMMARY OF THE INVENTION

Accordingly, an object of the present invention is to provide an optical transmission substrate capable of solving the foregoing problems, a method for manufacturing the optical transmission substrate and an optoelectronic integrated circuit. This object is achieved by combination of features described in independent claims in scope of claims. Moreover, more advantageous concrete examples of the present invention will be defined by dependent claims.

According to a first aspect of the present invention, provided is an optical transmission substrate including: a first substrate; an optical waveguide, which consists of a core and a clad covering periphery of the core, extends on an upper surface of the first substrate; a second substrate provided parallel to the first substrate so that a lower surface thereof contacts an upper surface of the optical waveguide; a reflection surface which is provided on a cross section of the core at an end of the optical waveguide and reflects light, which travels through the core of the optical waveguide, toward the second substrate; and a light guide which is provided in the second substrate and guides the light, which is reflected toward the second substrate, toward an upper surface of the second substrate from a position closer to the core than an upper surface of the clad.

According to a second aspect of the present invention, provided is a method for manufacturing an optical transmission substrate, including: a lower clad layer formation step of forming a lower clad layer of an optical waveguide on an upper surface of a first substrate; a core formation step of forming a core of the optical waveguide; a metal film formation step of forming a metal film above the core at an end of the optical waveguide; an upper clad layer formation step of forming an upper clad layer above the core in the optical waveguide in a state where the metal film is formed; a substrate lamination step of laminating a second substrate on an upper surface of the upper clad layer; an opening formation step of selectively removing the second substrate laminated on the metal film and forming an opening extending to an upper surface of the metal film from an upper surface of the second substrate; and a metal film removal step of selectively removing the metal film.

According to a third aspect of the present invention, provided is an optoelectronic integrated circuit including: a multilayer substrate having an optical transmission line; first and second electronic devices which are mounted on the multilayer substrate; a light emitting part which converts an electric signal outputted from a signal pin included in the first electronic device into an optical signal and transmits the optical signal through the optical transmission line; and a light receiving part which receives the optical signal transmitted through the optical transmission line, converts the optical signal into the electric signal and inputs the electric signal to a signal pin included in the second electronic device. The multilayer substrate includes: a first substrate; an optical waveguide which has clad covering a core and a periphery of the core and extends on an upper surface of the first substrate; a second substrate provided parallel to the first substrate so that a lower surface thereof contacts an upper surface of the optical waveguide; a first light guide which is provided in the second substrate and guides an optical signal inputted from the light emitting part to a position closer to the core than an upper surface of the clad; a first reflection surface which is provided on a cross section of the core at a first end of the optical waveguide, reflects the optical signal guided from an upper surface of the second substrate by the first light guide and transmits the optical signal through the core of the optical waveguide; a second reflection surface which is provided on a cross section of the core at a second end of the optical waveguide and reflects the optical signal, which travels through the core of the optical waveguide, toward the second substrate; and a second light guide which is provided in the second substrate and guides the optical signal, which is reflected toward the second substrate, to the light receiving part from the position closer to the core than the upper surface of the clad.

Note that the above-described summary of the invention is not one enumerating all necessary features of the present invention. Subcombinations of these feature groups can also be inventions.

BRIEF DESCRIPTION OF THE DRAWINGS

For a more complete understanding of the present invention and the advantages thereof, reference is now made to the following description taken in conjunction with the accompanying drawings.

FIG. 2(a) shows a lower clad layer formation step and FIGS. 2(b) and (c) show a side and an upper surface of the optical transmission substrate 10, respectively, in a reflection part formation step.

FIG. 3(a) shows a state where a photoresist is formed in the reflection part formation step, FIG. 3(b) shows a state where an evaporated metal film 310 is evaporated and FIG. 3(c) shows a state where the evaporated metal film 310 is lifted off.

FIGS. 4(a) and 4(b) show the side and the upper surface of the optical transmission substrate 10, respectively, in a core formation step and FIG. 4(c) shows a metal film formation step.

FIG. 5(a) shows an upper clad layer formation step, FIG. 5(b) shows a substrate lamination step and FIG. 5(c) shows an opening formation step.

FIG. 6(a) shows a metal film removal step and FIG. 6(b) shows a light guide installation step.

FIG. 7(a) shows a step of providing a reflection part 150 in the reflection part formation step and FIGS. 7(b) and 7(c) show a step of forming a tilted portion 155.

FIGS. 8(a)–8(c) are second views showing the method for manufacturing the optical transmission substrate 10 according to the first modified example of this embodiment. FIG. 8(a) shows a step of forming a reflection surface 160, FIG. 8(b) shows a step of removing a part of the reflection part 150, FIG. 8(c) shows a step of forming an optical waveguide 130 and FIG. 8(d) shows the metal film formation step and the substrate lamination step.

FIG. 9(a) shows the substrate lamination step, FIG. 9(b) shows the opening formation step, FIG. 9(c) shows the metal film removal step and FIG. 9(d) shows the light guide installation step.

DETAILED DESCRIPTION OF THE PREFERRED EMBODIMENTS

The present invention will be described below through embodiments of the invention. However, the invention according to scope of claims is not limited to the following embodiments. Moreover, not all combinations of features described in the embodiments are essential to solving means of the invention.

Figure 1:
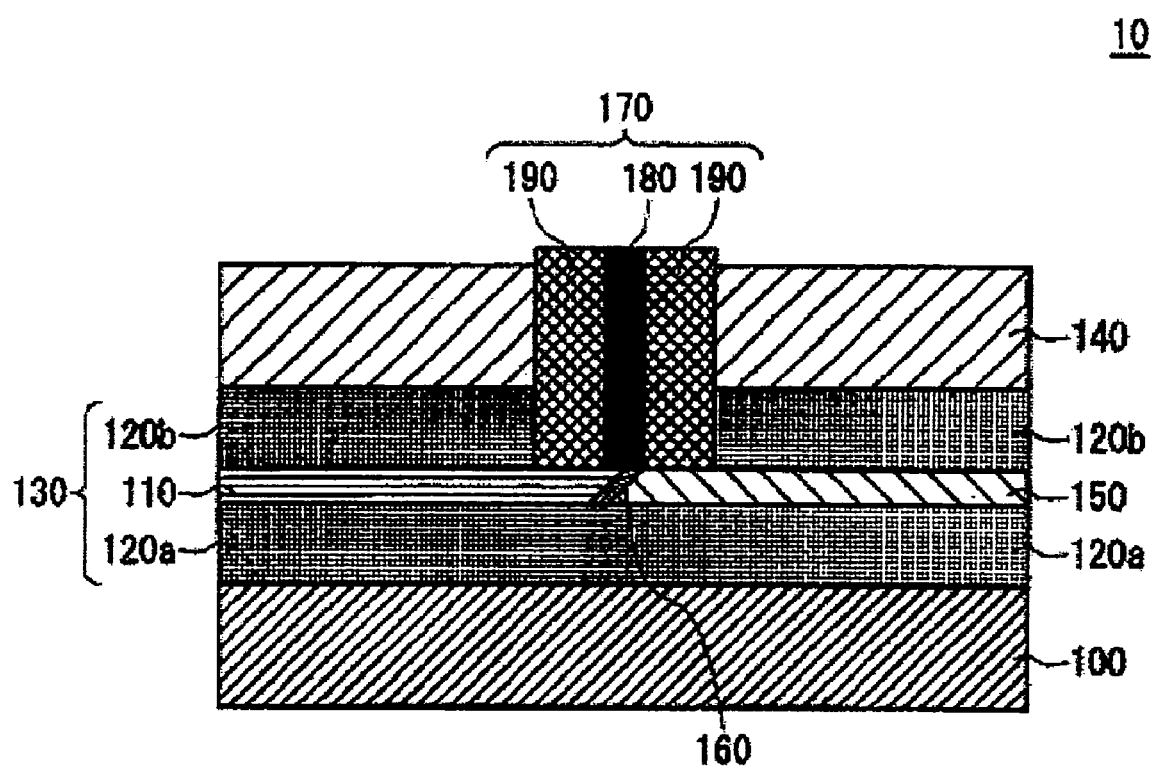
FIG. 1 shows a configuration of an optical transmission substrate 10 according to this embodiment.

FIG. 1 shows a configuration of an optical transmission substrate 10 according to this embodiment. The optical transmission substrate 10 according to this embodiment has the configuration in which an optical waveguide 130 is provided between a first substrate 100 and a second substrate 140 and light reflected from the optical waveguide 130 toward the second substrate 140 is guided to vicinity of an upper surface of the second substrate 140 by an optical fiber 170. Thus, positioning of an end of the optical waveguide 130 and the optical fiber 170 is facilitated and a high coupling efficiency can be realized. Moreover, the provision of the optical waveguide 130 between the first and second substrates 100 and 140 makes it possible to prevent damage of the optical waveguide 130 attributable to warp of the optical transmission substrate 10 or the like and damage of the optical waveguide 130 attributable to heat generated in a manufacturing process and an operation of an electronic device.

The optical transmission substrate 10 includes the first substrate 100, the optical waveguide 130, the second substrate 140, a reflection part 150 and the optical fiber 170. The first substrate 100 may be a printed circuit board such as a glass epoxy (FR4) substrate having electric interconnect provided thereon or may be a multilayer printed circuit board. In addition, the first substrate 100 may also adopt a configuration in which SLC (Surface Laminate Circuit) built-up substrates are laminated. The optical waveguide 130 includes a core 110 through which light passes and clad 120 (120a and 120b) which coats a periphery of the core 110. The optical waveguide 130 extends on an upper surface of the first substrate 100. In this embodiment, the core 110 of the optical waveguide 130 is formed to have a shape of, for example, a 50×50 μm square pole, which has an upper surface parallel to the first and second substrates 100 and 140, for the purpose of facilitating formation of the core 110 and increasing a contact area with the optical fiber 170. The second substrate 140 is provided parallel to the first substrate 100 so as to have its lower surface contact an upper surface of the optical waveguide 130. The second substrate 140 may adopt a structure similar to that of the first substrate 100.

The reflection part 150 is provided on an upper surface of the clad 120a coating a lower portion of the core 110 so as to face the core 110 of the optical waveguide 130 and has a reflection surface 160. The reflection surface 160 is provided on a cross section of the core 110 at the end of the optical waveguide 130 and reflects light, which travels through the core 110 of the optical waveguide 130, toward the second substrate 140. More specifically, the reflection surface 160 is provided at a 45-degree angle to an extending direction of the core 110 and reflects the light, which travels through the core 110, toward the second substrate 140 approximately vertically to the second substrate 140.

The optical fiber 170 is one example of a light guide according to the present invention. The optical fiber 170 is provided in the second substrate 140 and guides the light, which is reflected toward the second substrate 140 by the reflection surface 160, toward the upper surface of the second substrate. 140 from a position closer to the core 110 than the upper surface of the clad 120. The optical fiber 170 according to this embodiment is, for example, a multimode optical fiber such as a graded index optical fiber. The optical fiber 170 has a core part 180 and a clad part 190 and guides the light, which is reflected toward the second substrate 140, toward the upper surface of the second substrate 140 by use of the core part 180. Here, in order to facilitate insertion of the optical fiber 170 into an opening provided in the second substrate 140, it is preferable that the optical fiber 170 has a circular cross section.

The core part 180 of the optical fiber 170 contacts the upper surface of the core 110 at the end of the optical waveguide 130. Here, at the end of the optical waveguide 130, the core part 180 of the optical fiber 170 may be bonded to the upper surface of the core 110 by use of an optical adhesive. Thus, the core 110 of the optical waveguide 130 and the core part 180 of the optical fiber 170 are directly coupled with each other. Consequently, a coupling efficiency can be improved.

Alternatively, a structure, in which the clad 120b above the core 110 at the end of the optical waveguide 130 is thinner than the clad 120b above the core 110 in a center portion of the optical waveguide 130, may be adopted. In this case, the optical fiber 170 receives the light, which is reflected toward the second substrate 140, through the thin clad 120b in a position closer to the core 110 of the optical waveguide 130 than the upper surface of the clad 120b.

Instead of the one described above, the optical fiber 170 may be a GRIN lens (Graded Index Lens) through which light travels while being condensed in a center portion thereof or may also be a hollow-core optical fiber. Here, in the case of realizing the optical fiber 170 by use of the graded index optical fiber, the GRIN lens or the like, a length of the optical fiber 170 is determined so as to converge light on a light receiving element provided in an upper end of the optical fiber 170. Moreover, in the case of realizing the optical fiber 170 by use of the hollow-core optical fiber, as disclosed in nonpatent document 5, a hole having such a size and a period as to be a forbidden band for light propagated through the optical fiber 170 is provided around a core to be a photonic crystal.

Although the configuration of the optical transmission substrate 10 at the light receiving element side has been described above, a configuration similar to that described above is also adopted for a light emitting element side. The following shows a difference between the light emitting element side and the light receiving element side in functions of the optical fiber 170 and the reflection surface 160. The optical fiber 170 at the light emitting element side is provided in the second substrate 140 and guides light received from a light emitting element to a position closer to the core 110 than the upper surface of the clad 120b. Moreover, the reflection surface 160 at the light emitting element side is provided on the cross section of the core 110 at the end of the optical waveguide 130. The reflection surface 160 reflects an optical signal guided from the upper surface of the second substrate 140 by the optical fiber 170 and allows the core 110 of the optical waveguide 130 to transmit the optical signal.

In this case, the optical fiber 170 at the light emitting element side may be provided on a surface opposite to that of the light receiving element side in the optical transmission substrate 10. More specifically, a configuration may be adopted, in which the optical fiber 170 at the light emitting element side is provided in the first substrate 100 and guides the light received from the light emitting element to a position closer to the core 110 than a lower surface of the clad 120a. Furthermore, when the optical transmission substrate 10 includes a plurality of the optical waveguides 130, a configuration may be adopted, in which the optical fibers 170 at the light emitting element side and the light receiving element side, which are provided so as to correspond to the respective optical waveguides 130, are provided on any of upper surface and lower surface sides of the optical transmission substrate 10, respectively.

According to the optical transmission substrate 10 described above, by determining a position for providing the opening extending to the end of the optical waveguide 130 from the upper surface of the second substrate 140, alignment between the core 110 of the optical waveguide 130 and the core part 180 of the optical fiber 170 can be performed. Thus, alignment of an insertion direction of the optical fiber 170 is not required. Consequently, accurate determination of the position of the opening can facilitate the alignment.

Moreover, the coupling efficiency can be improved in such a manner that the optical fiber 170 at the light emitting element side guides light to the position closer to the core 110 than the upper surface of the clad 120b at the end of the optical waveguide 130 or to the core 110 itself and the optical fiber 170 at the light receiving element side receives light from the position closer to the core 110 than the upper surface of the clad 120b at the other end of the optical waveguide 130 or from the core 110 itself. Furthermore, the upper surface of the core 110 and the reflection surface 160 are formed to be optically flat. Thus, loss caused by scattering can be reduced and the light can be propagated with a high coupling efficiency between the optical fiber 170 and the core 110.

Moreover, the optical transmission substrate 10 adopts a structure in which an optical waveguide layer, in which the optical waveguide 130 is provided, is sandwiched symmetrically from above and below by the first and second substrates 100 and 140. Thus, resistance of the optical waveguide 130 to mechanical damage can be improved and heat resistance of the optical waveguide 130 can be improved. More specifically, since the optical waveguide 130, which is vulnerable to heat, is sandwiched by the first and second substrates 100 and 140, even if the temperature becomes high and somewhat exceeds a softening point of the optical waveguide 130, the function of the optical waveguide 130 can be restored when the temperature returns to normal.

Figure 2:
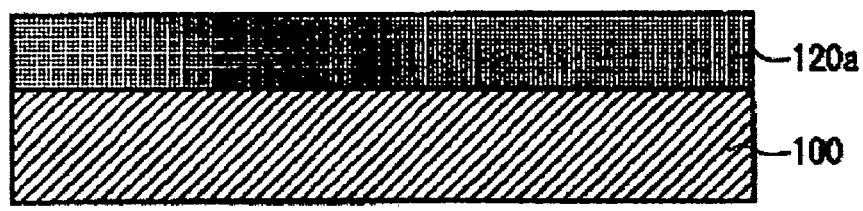
FIGS. 2(a)–2(c) are first views showing a method for manufacturing the optical transmission substrate 10 according to this embodiment.
Figure 2:
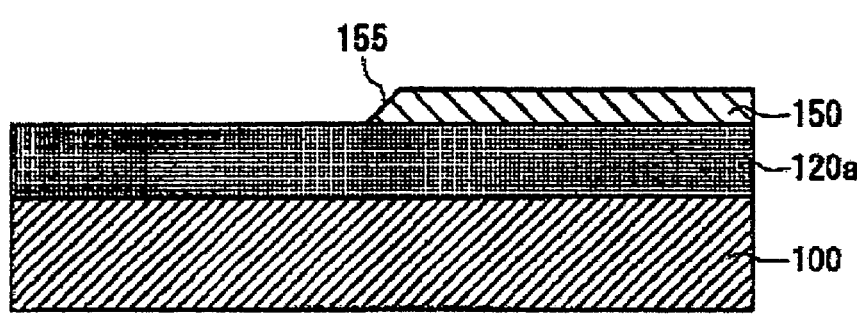
Figure 2:
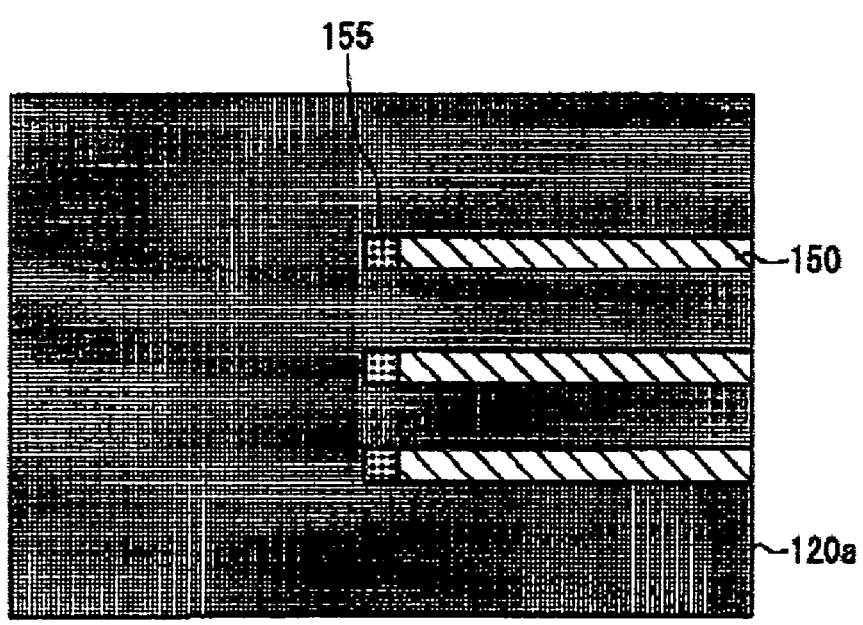

FIG. 2 is a first view showing a method for manufacturing the optical transmission substrate 10 according to this embodiment.

First, the first substrate 100 is prepared. Next, as shown in FIG. 2(a), in a lower clad layer formation step, the lower clad layer of the optical waveguide 130 is formed on the upper surface of the first substrate 100. This lower clad layer is a layer to be the clad 120a in the optical waveguide 130 of FIG. 1. More specifically, polysilane A to be the clad 120a of the optical waveguide 130 is applied onto the first substrate 100 by spin coating or curtain coating, pre-baked at 120□ and calcined at 250□. Thus, the lower clad layer is formed.

Next, FIGS. 2(b) and 2(c) show the side and the upper surface of the optical transmission substrate 10. As shown in FIGS. 2(b) and 2(c), in a reflection part formation step, the reflection part 150 is formed on an upper surface of the lower clad layer. Specifically, the reflection part 150 has a tilted portion 155 for providing the reflection surface 160 reflecting light, which travels through the core 110 of the optical waveguide 130, toward the second substrate 140. In this embodiment, a cross section of the reflection part 150 is a 50×50 μm square, which is the same thickness as that of the core 110 of the optical waveguide 130.

More specifically, in a mirror support formation step included in the reflection part formation step, polyimide, polysilane and the like are molded to form the reflection part 150 that is a component (mirror support) to be the reflection surface 160 which is tilted at 45 degrees. In other words, for example, a mold is placed on the clad 120a while being bonded thereto and a polyimide material or a polysilane material is injected into the mold. After further heating the mold to be hardened, the mold is removed. Thus, the reflection part 150 of a shape having the tilted portion 155 with a 45-degree surface is formed.

Figure 3:
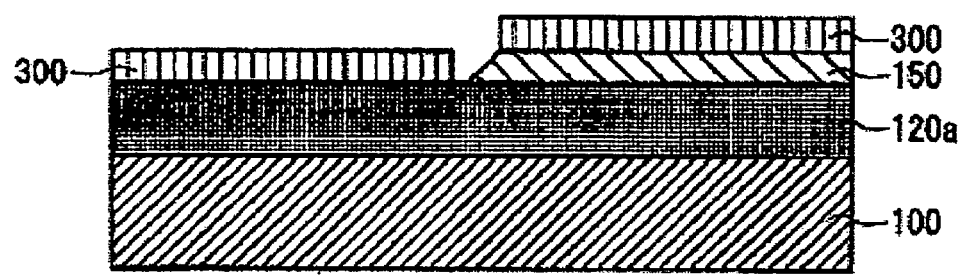
FIGS. 3(a)–3(c) are second views showing the method for manufacturing the optical transmission substrate 10 according to this embodiment.
Figure 3:
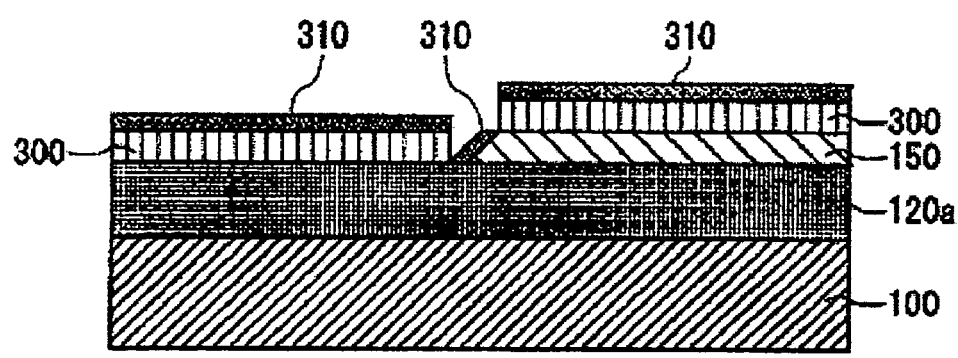
Figure 3:
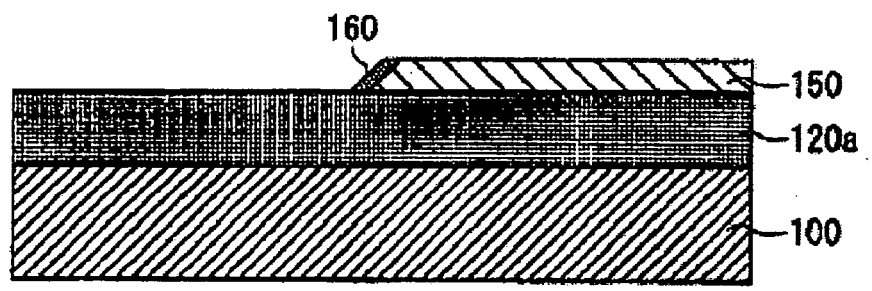

FIG. 3 is a second view showing the method for manufacturing the optical transmission substrate 10 according to this embodiment.

Next, as shown in FIG. 3(a), in a photoresist formation step in the reflection part formation step, a photoresist 300 is formed in such a manner that the tilted portion 155 is exposed to the upper surface side of the optical transmission substrate 10 and the other portions are covered with the photoresist 300. Next, as shown in FIG. 3(b), in a vapor deposition step in the reflection part formation step, aluminum or silver is evaporated onto the upper surface of the optical transmission substrate 10. Thus, an evaporated metal film 310 is formed on upper surfaces of the photoresist 300 and the tilted portion 155. Next, as shown in FIG. 3(c), in a lift-off step in the reflection part formation step, the photoresist 300 is lifted off to remove the photoresist 300 and aluminum or silver which is evaporated onto the upper surface of the photoresist 300. As a result, aluminum or silver is evaporated onto the tilted portion 155 and the reflection surface 160 can be formed.

Figure 4:
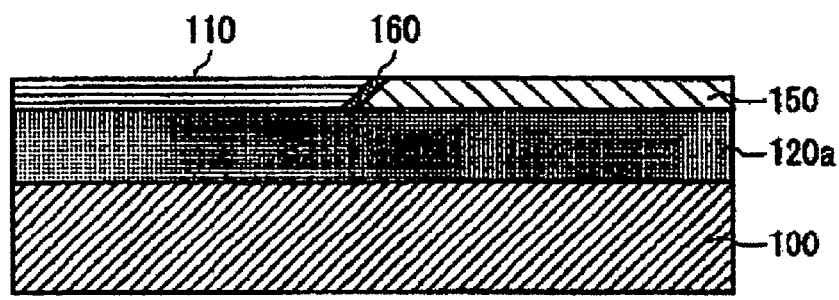
FIGS. 4(a)–4(c) are third views showing the method for manufacturing the optical transmission substrate 10 according to this embodiment.
Figure 4:
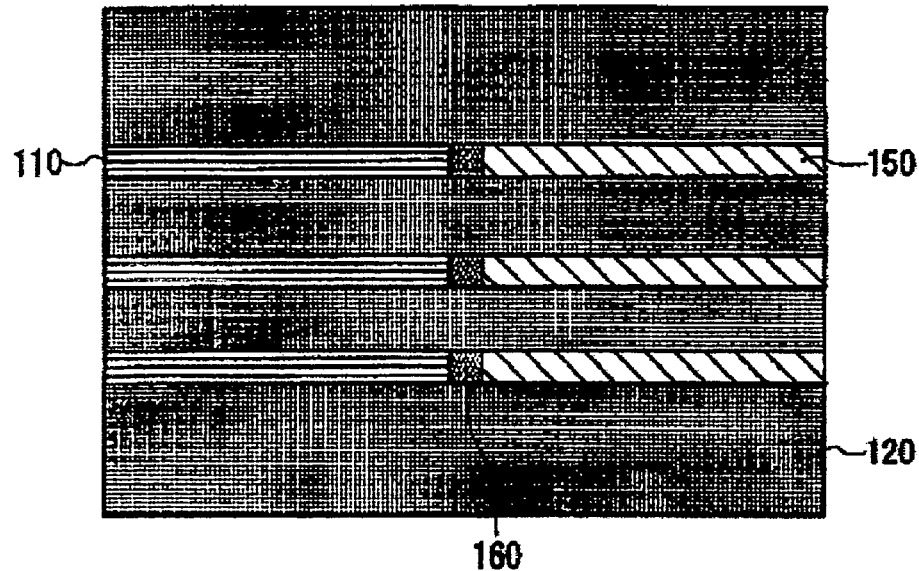
Figure 4:
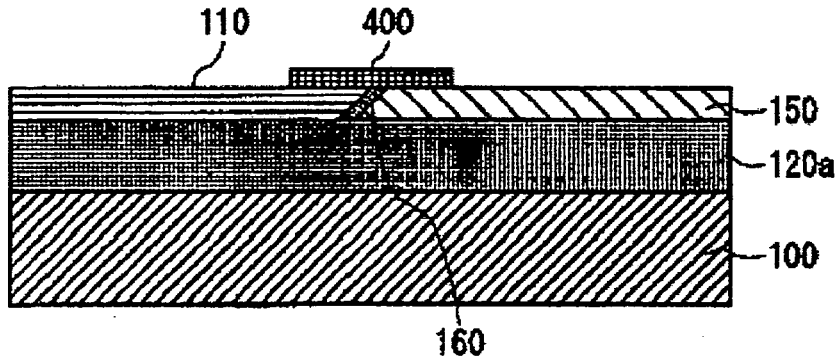

FIG. 4 is a third view showing the method for manufacturing the optical transmission substrate 10 according to this embodiment.

Next, FIGS. 4(a) and 4(b) show the side and the upper surface of the optical transmission substrate 10. As shown in FIGS. 4(a) and 4(b), in a core formation step, the core 110 of the optical waveguide 130 is formed in such a manner that the cross section of the core 110 contacts the reflection surface 160 at the end of the optical waveguide 130. More specifically, as in the case of the lower clad layer formation step, polysilane B is applied onto the first substrate 100, on which the lower clad layer is formed, by spin coating or curtain coating and is pre-baked. Thus, a layer having a thickness of 50 micrometers is formed. Accordingly, a photomask pattern having an opening in a portion to be the core 110 of the optical waveguide 130 is formed on the layer of polysilane B and irradiated with ultraviolet rays to increase a refractive index of the portion to be the core 110 in the layer of polysilane B. Thus, the core 110 is formed. Here, the polysilane A and the polysilane B may be polysilane of the same material. Alternatively, the polysilane A may be polysilane into which a material more suitable for the clad is mixed and the polysilane B may be polysilane into which a material more suitable for the core is mixed.

As a result, the upper surface of the optical transmission substrate 10 is flattened and the following structure is formed. Specifically, in the structure, the core 110 of the optical waveguide 130, the layer of polysilane B and the reflection surface 160 are buried in the upper surface of the optical transmission substrate 10, the layer of polysilane B remaining as the clad 120 on the side of the core 110 as a result of being covered up from the ultraviolet rays by the photomask pattern. In addition, the cross section of the core 110 at the end of the optical waveguide 130 contacts the reflection surface 160.

Next, as shown in FIG. 4(c), in a metal film formation step, a metal film 400 is formed on the upper surface of the core 110 at the end of the optical waveguide 130. This metal film 400 serves as a stopper for forming an opening by making a hole down to immediately above the core 110 from the upper surface of the second substrate 140 in order to insert the optical fiber 170 from the upper surface of the second substrate 140 and allow the core part 180 of the optical fiber 170 and the core 110 of the optical waveguide 130 to directly contact each other.

More specifically, on the core 110 positioned immediately above the reflection surface 160 at the end of the optical waveguide 130, a copper circular pattern to be the metal film 400 is evaporated by use of a lift-off method.

Figure 5:
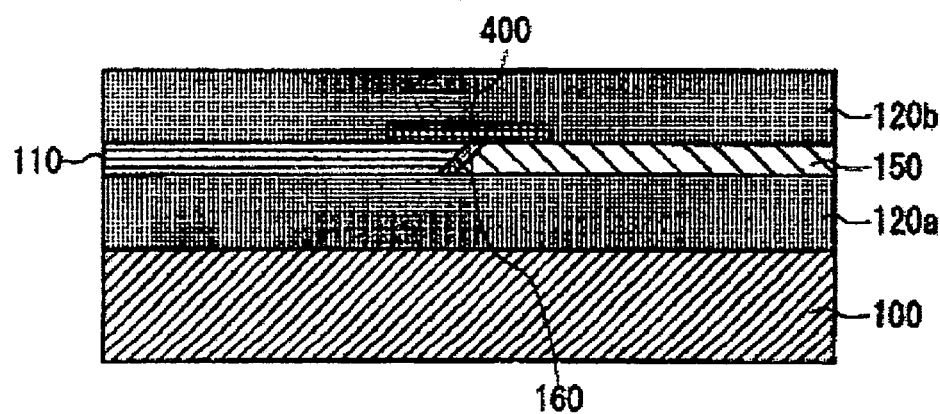
FIGS. 5(a)–5(c) are fourth views showing the method for manufacturing the optical transmission substrate 10 according to this embodiment.
Figure 5:
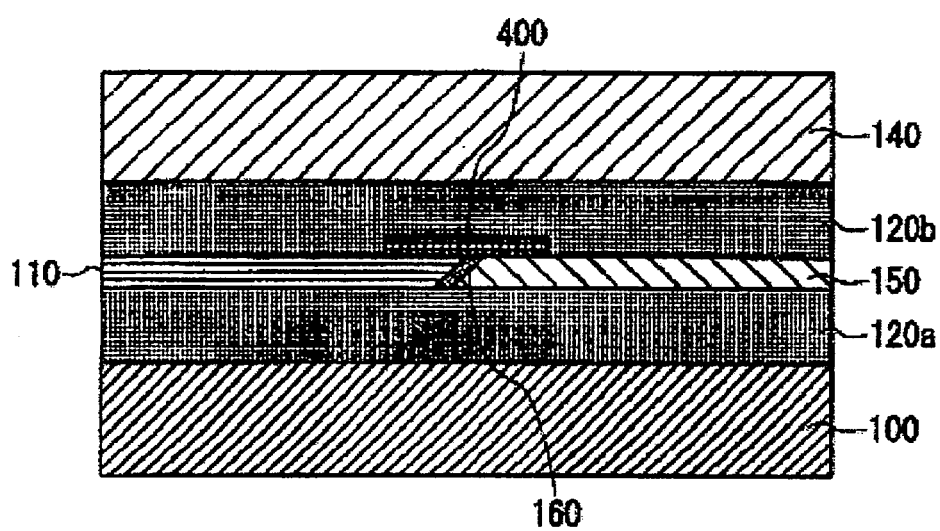
Figure 5:
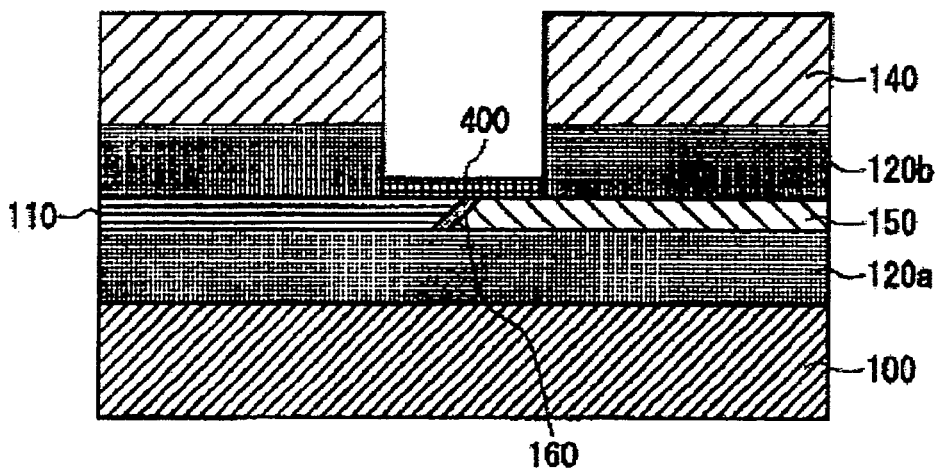

FIG. 5 is a fourth view showing the method for manufacturing the optical transmission substrate 10 according to this embodiment.

Next, as shown in FIG. 5(a), in an upper clad layer formation step, an upper clad layer is formed on and above the core 110 in the optical waveguide 130 in a state where the metal film 400 is formed. This upper clad layer is a layer to be the clad 120b in the optical waveguide 130 of FIG. 1. In this embodiment, in order for the clad 120b to have a sufficient thickness, the upper clad layer is also formed on the metal film 400 in addition to on the core 110 in the optical waveguide 130. More specifically, as in the case of the lower clad layer formation step, the same polysilane A as that of the lower clad layer is applied to cover the polysilane B layer. Thus, the structure of the optical waveguide is formed.

Next, as shown in FIG. 5(b), in a substrate lamination step, the second substrate 140 is laminated on an upper surface of the upper clad layer. Thus, the first substrate 100 and the second substrate 140 are attached to each other so as to put the optical waveguide 130 therebetween. Accordingly, a piece of board is obtained. The structure of FIG. 5(b) is the same as that of a board used in a normal SLC manufacturing process except that the optical waveguide 130 is provided in the center thereof. Therefore, an electric interconnect portion can be completed by using a SLC process generally used to perform pattern formation of electric interconnect, via hole production by use of a carbon dioxide laser, a plating process and the like. Here, if it is required to produce a via for the electric interconnect directly above or directly below the optical waveguide 130, in the step of forming the first substrate 100, in which the hole is produced, or the second substrate 140, a copper pattern for protecting the optical waveguide 130 is formed beforehand in the first substrate 100 or the second substrate 140. This process can be performed as a part of usual pattern formation of a printed circuit board.

Next, as shown in FIG. 5(c), in an opening formation step, the second substrate 140 and the clad 120b, which are laminated on the metal film 400, are selectively removed to form an opening extending to the upper surface of the metal film 400 from the upper surface of the second substrate 140.

More specifically, a position corresponding to the metal film 400 in the upper surface of the second substrate 140 is irradiated with a laser having a first wavelength. Thus, resin and glass epoxy, which are materials of the second substrate 140, are selectively removed to form the opening in the second substrate 140. Here, copper reflects the carbon dioxide laser. Thus, by using the carbon dioxide laser as the laser having the first wavelength, the hole production is stopped in a pattern portion of the metal film 400 and the core 110 of the optical waveguide 130 is not damaged.

Figure 6:
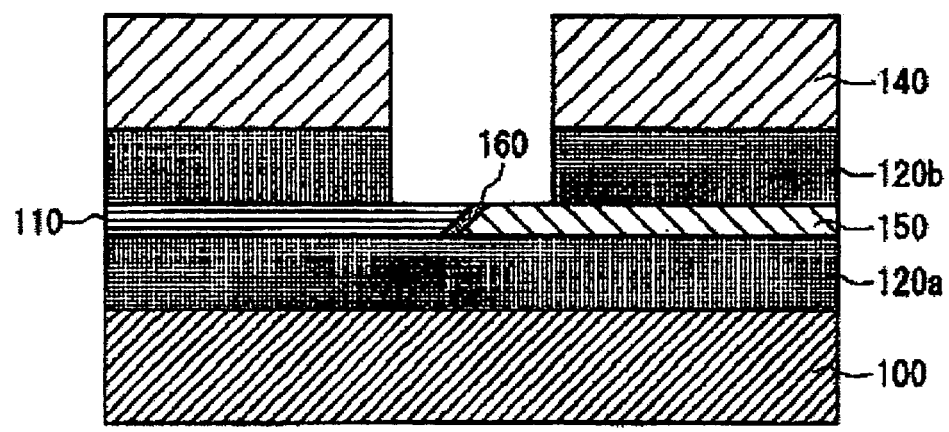
FIGS. 6(a)–6(b) are fifth views showing the method for manufacturing the optical transmission substrate 10 according to this embodiment.
Figure 6:
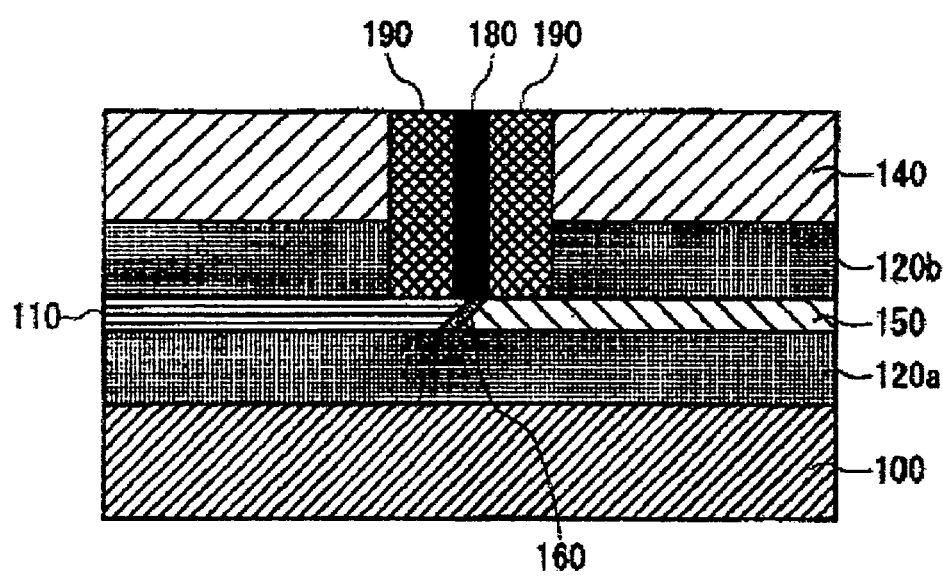

FIG. 6 is a fifth view showing the method for manufacturing the optical transmission substrate 10 according to this embodiment.

Next, as shown in FIG. 6(a), in a metal film removal step, the metal film 400 is selectively removed. More specifically, the metal film 400 made of copper is irradiated with a laser having a second wavelength, which is different from the first wavelength. Thus, the metal film 400 is removed. Here, second harmonic of a YAG laser has a wavelength of 530 nm and is absorbed by copper. However, the second harmonic is not absorbed by polysilane or glass. Thus, by using the second harmonic YAG laser as the laser having the second wavelength, the metal film 400 can be selectively removed. Furthermore, in this step, a guide hole, into which a guide pin is inserted, is also produced, the guide pin being used for alignment in mounting an optical element or the optical fiber 170.

Next, as shown in FIG. 6(b), in a light guide installation step, the optical fiber 170 guiding light, which is received from a light emitting part, to the core 110 at a first end of the optical waveguide 130 and the optical fiber 170 guiding light, which travels through the core 110 and is reflected toward the second substrate 140 at a second end of the optical waveguide 130, toward the upper surface of the second substrate 140 from the position where the metal film 400 is removed are provided in the respective openings. More specifically, a multimode optical fiber having a core diameter of 50 micrometers, which is cut so as to have the same height as the surface of the optical transmission substrate 10, is inserted into the opening and an optical device is mounted thereon. Here, in the light guide installation step according to this embodiment, a light guide which contacts the core 110 at the end of the optical waveguide 130 is installed. In this event, it is preferable that the coupling efficiency is further improved in such a manner that the core 110 at the end of the optical waveguide 130 and the light guide are bonded to each other by use of an optical adhesive and a difference in the refractive index between the core 110 and the core part 180 is reduced.

According to the above-described method for manufacturing the optical transmission substrate, after the metal film 400 is provided directly above the core 110 at the end of the optical waveguide 130 and the second substrate 140 and the like are selectively removed, the metal film 400 is selectively removed. Thus, the coupling efficiency of the core 110 and the optical fiber 170 can be improved. Moreover, the opening is provided in the position corresponding to the metal film 400 in the upper surface of the second substrate 140. Thus, alignment between the optical fiber 170 and the end of the optical waveguide 130 can be performed. Accordingly, the optical fiber 170 and the end of the optical waveguide 130 can be accurately connected to each other. Consequently, by use of the method for manufacturing an optical transmission substrate according to the present invention, it is possible to form an optical transmission line which has a high coupling efficiency and can transmit an optical signal at a higher speed.

Moreover, according to the above-described method for manufacturing an optical transmission substrate, the optical waveguide 130 is sandwiched between the first and second substrates 100 and 140. Thus, it is possible to manufacture the optical transmission substrate 10 with a high mechanical resistance and a high heat resistance.

In the configuration described above, the optical transmission substrate 10 may be formed to have a structure in which the clad 120b above the core 110 at the end of the optical waveguide 130 is thinner than the clad 120b above the core 110 in the center portion of the optical waveguide 130. In this case, the foregoing manufacturing process will be changed as described below.

Before the metal film 400 is formed and after the core 110 of the optical waveguide 130 is formed, that is, in the state of FIG. 4(c), a core upper clad layer formation step of forming a core upper clad layer on the upper surface of the core 110 of the optical waveguide 130 is provided. Accordingly, in the metal film formation step, the metal film 400 is formed on an upper surface of the core upper clad layer at the end of the optical waveguide 130. Thus, the metal film 400 is formed on the core 110. Next, in the upper clad layer formation step, the upper clad layer is formed on the upper surface of the core upper clad layer in the optical waveguide 130 in the state where the metal film 400 is formed. As a result, the core upper clad layer, the metal film 400 and the upper clad layer are laminated directly above the core 110.

Next, in the opening formation step, the second substrate 140 and the upper clad layer, which are laminated on the metal film 400, are selectively removed to form an opening. Thereafter, in the light guide installation step, a light guide which contacts the core upper clad layer at the end of the optical waveguide 130 is installed.

As a result, it is possible to perform optical connection between the optical fiber 170 and the core 110 through the clad which is thinner at the end of the optical waveguide 130 than in the center portion thereof.

Moreover, in the manufacturing method described above, as a method for removing the metal film 400, a femtosecond laser for processing, that is, a femtosecond titanium sapphire laser, for example, may be irradiated on the metal film 400 in the metal film removal step. By use of the femtosecond laser for processing, the irradiation can be performed after an auxiliary laser performs precise control of a focal depth of the femtosecond laser for processing with high resolution. Accordingly, only the metal film 400 can be removed without inflicting thermal damage on the optical waveguide 130. Moreover, the metal film 400 can be removed regardless of the material of the metal film 400.

Moreover, in the metal film removal step, the metal film 400 may be removed by reactive ion etching. More specifically, a portion of the second substrate 140 other than that in the position corresponding to the metal film 400 is covered with the photoresist and placed in a reactive ion etching apparatus. Thereafter, CO gas and $NH_3$ gas are introduced in vacuum, a plasma is generated by high-frequency wave excitation and an electric field is applied. Thus, the metal film 400 made of copper can be selectively etched by utilizing reaction between gas and metal. This method is effective when a large number of openings for the optical fiber 170 are provided.

Moreover, in the manufacturing method described above, gold may be used as the material of the metal film 400. In this case, in the metal film removal step, a metal film 400 made of gold is irradiated with a second harmonic titanium sapphire laser having a wavelength of 450 nm. Thus, the metal film 400 is removed.

Figure 7:
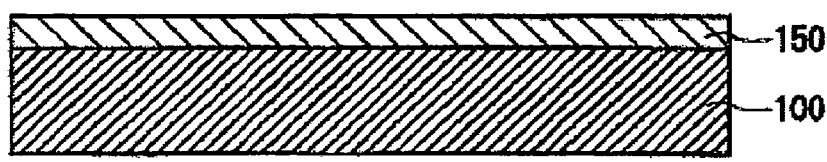
FIGS. 7(a)–7(c) are first views showing a method for manufacturing an optical transmission substrate 10 according to a first modified example of this embodiment.
Figure 7:
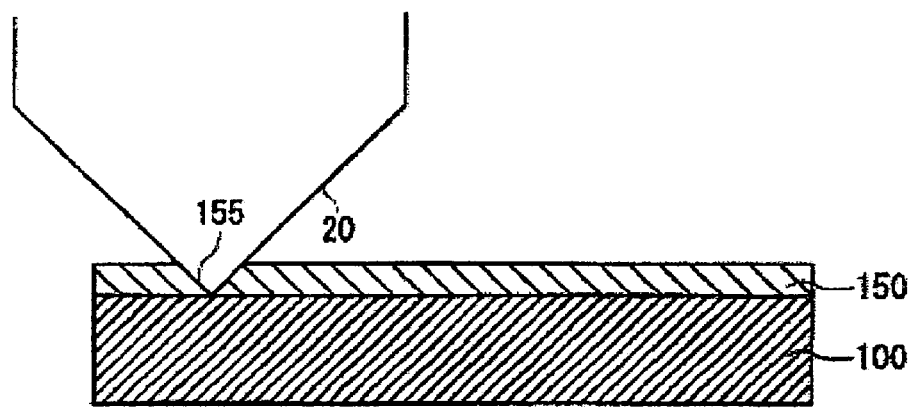
Figure 7:
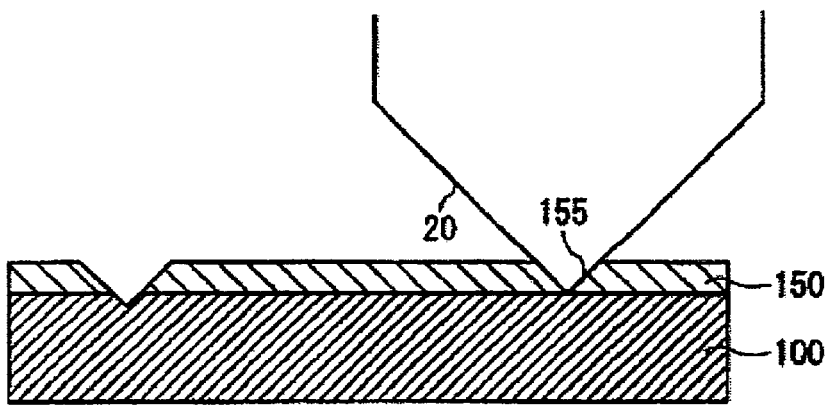

FIG. 7 is a first view showing a method for manufacturing the optical transmission substrate 10 according to a first modified example of this embodiment.

First, as shown in FIG. 7(a), in the mirror support formation step in the reflection part formation step, on the first substrate 100, polysilane having a thickness of 150 µm, which is equivalent to the thickness of the three layers including the clad 120a, the core 110 and the clad 120b, is applied and pre-baked at 120□. Next, as shown in FIGS. 7(b) and 7(c), by use of a blade 20 having a tilt angle of 45 degrees, the reflection part 150 at an end of a polymer waveguide (PWG) to be the optical waveguide 130 is diced. Thus, tilted portions 155 are formed at two spots including an incidence side and an exit side.

Figure 8:
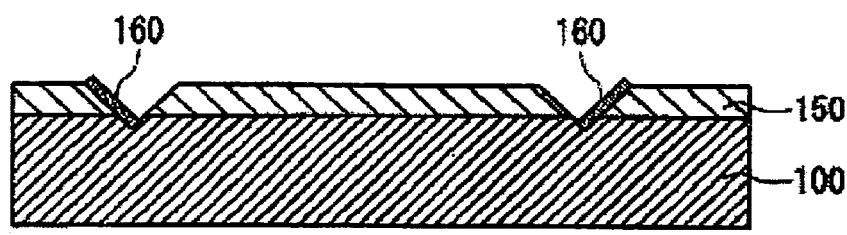
Figure 8:
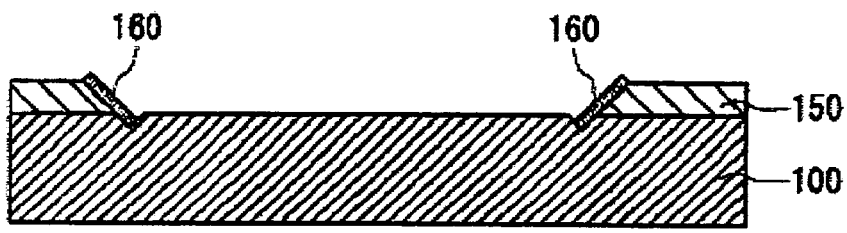
Figure 8:
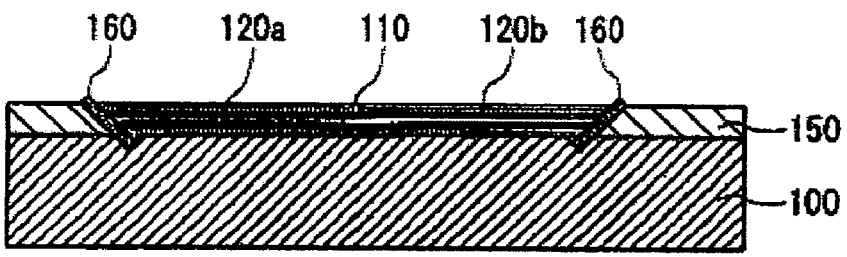
Figure 8:
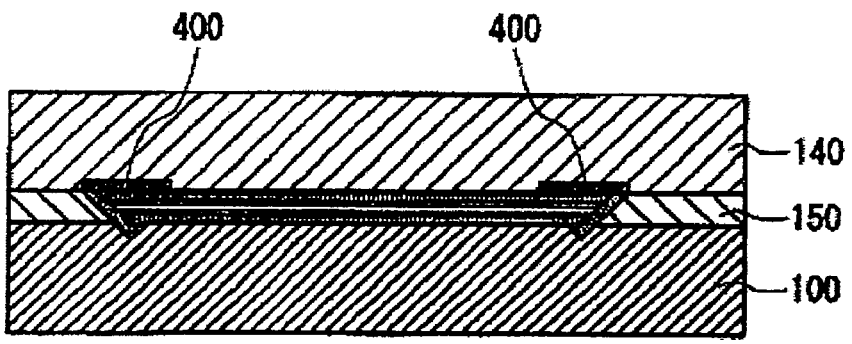

FIG. 8 is a second view showing the method for manufacturing the optical transmission substrate 10 according to the first modified example.

Next, as shown in FIG. 8(a), in the vapor deposition step in the reflection part formation step, aluminum or silver is laminated by vapor deposition or sputtering and reflection surfaces 160 are formed. Here, when the reflection surfaces 160 are formed of silver, it is preferable that palladium of about 2.5 weight % and copper of about 2.5 weight % are added to silver to improve heat resistance of the reflection surfaces 160.

Next, as shown in FIG. 8(b), in an optical waveguide region removal step, a center portion of the reflection part 150 except for the portions where the reflection surfaces 160 are provided is subjected to mask exposure and development. Thus, the center portion of the reflection part 150 is removed while leaving both ends where the reflection surfaces 160 are provided.

Next, as shown in FIG. 8(c), in the lower clad layer formation step, the lower clad layer made of polysilane is applied again onto the center portion where polysilanae is removed and is calcined. Next, in the core formation step, a core material of polysilane is applied onto the lower clad layer and the mask exposure is performed. Thus, the core 110 is formed by photobleach and calcined. Thereafter, in the upper clad layer formation step, the upper clad layer is applied onto the core 110 and calcined. By performing the processes described above, an optical waveguide 130 having the reflection surfaces 160 provided at its both ends can be prepared, the reflection surfaces facing upward at 45 degrees. Here, the three layers are also formed of the clad material and the core material between the reflection surfaces 160 and the ends of the light guide. However, the clad 120b at the second substrate 140 side is formed to be sufficiently thin so as to have about the same thickness as the diameter of the core 110. Thus, loss of light attributable to this layer can be reduced.

In the core formation step described above, the core 110 may be formed in such a manner that a photosensitive core material is applied on the lower clad layer in a thickness of 50 µm, which is the thickness of the core 110, and subjected to the mask exposure and development.

Figure 9:
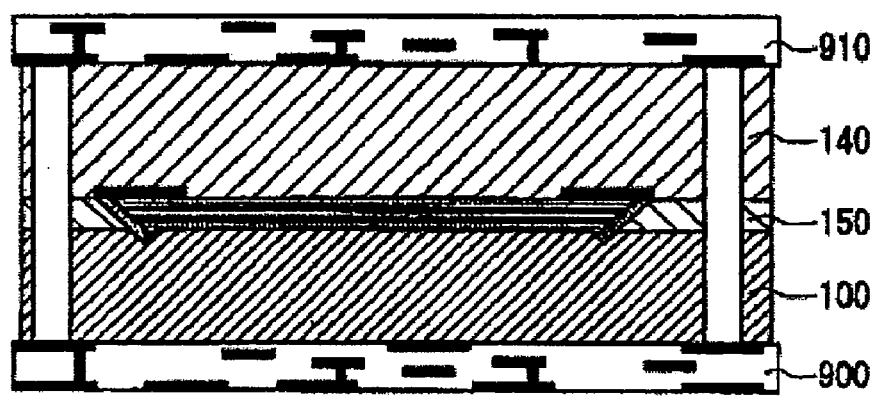
FIGS. 9(a)–9(d) are third views showing the method for manufacturing the optical transmission substrate 10 according to the first modified example of this embodiment.

Next, as shown in FIG. 8(d), in the metal film formation step, the metal films 400 are formed at the ends of the core 110 in the optical waveguide 130. Thereafter, in the substrate lamination step, the second substrate 140 is laminated on the upper surfaces of the upper clad layer and the reflection part 150. The above-described operations shown in FIG. 7(a) to FIG. 8(d) are repeated and the optical waveguides 130 are provided, respectively, in a plurality of layers of the reflection parts 150 provided in the optical transmission substrate 10. Thus, a multilayer structure for performing multilayer optical interconnect can be formed. In this case, the ends of the optical waveguides 130, which are positioned, respectively, in the plurality of layers of the reflection parts 150 provided in the optical transmission substrate 10, are provided in different positions from each other in the plane of the optical transmission substrate 10. In addition, the ends thereof are arranged so as not to overlap with each other when viewed from the upper surface or the lower surface of the optical transmission substrate 10. Here, as shown in FIG. 9(a), a third substrate 900 and a fourth substrate 910, such as SLC built-up substrates, may be laminated on the lower surface of the first substrate 100 and the upper surface of the second substrate 140, respectively.

Figure 9B:
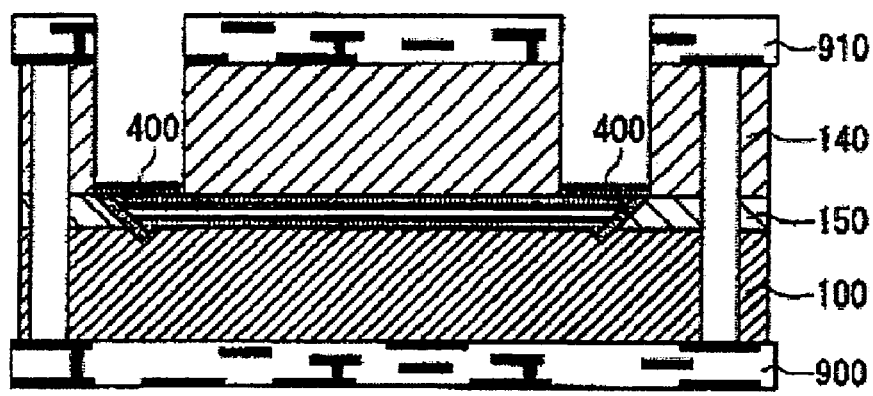
Figure 9C:
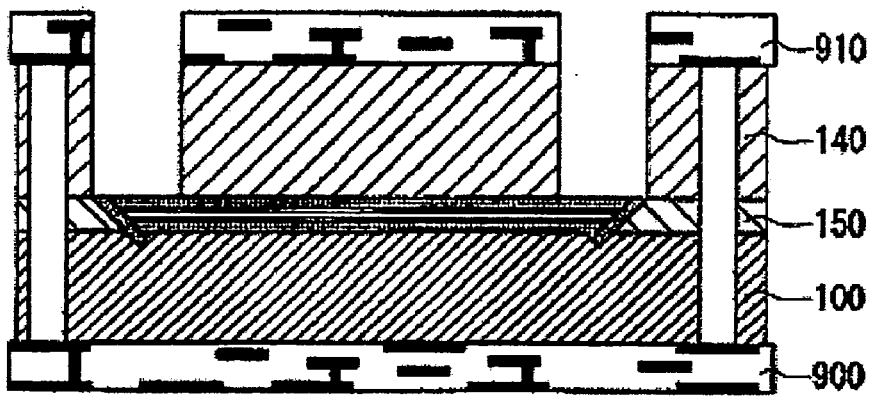
Figure 9D:
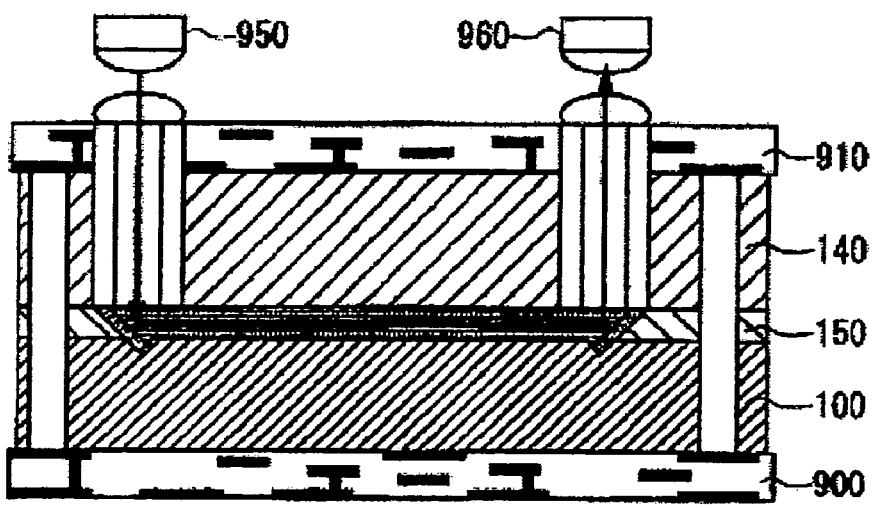

Next, as shown in FIG. 9(b), in the opening formation step, the fourth substrate 910 and the second substrate 140, which are laminated on the metal films 400, are selectively removed by use of the carbon dioxide laser. Accordingly, openings extending to the upper surfaces of the metal films 400 from the upper surface of the second substrate 140 are formed. Next, as shown in FIG. 9(c), in the metal film removal step, the metal films 400 are selectively removed. Thereafter, as shown in FIG. 9(d), in the light guide installation step, a multimode optical fiber, which is cut in a length to reach a surface of the fourth substrate 910, or a GRIN lens, of which focal length is optimized so as to focus light on a light receiving part 960, is inserted into each of the openings. Subsequently, a light emitting part 950 is provided above the light guide on the light emitting side and the light receiving part 960 is provided above the light guide on the light receiving side. Thus, optical signals can be transmitted from the light emitting part 950 to the light receiving part 960.

Figure 10:
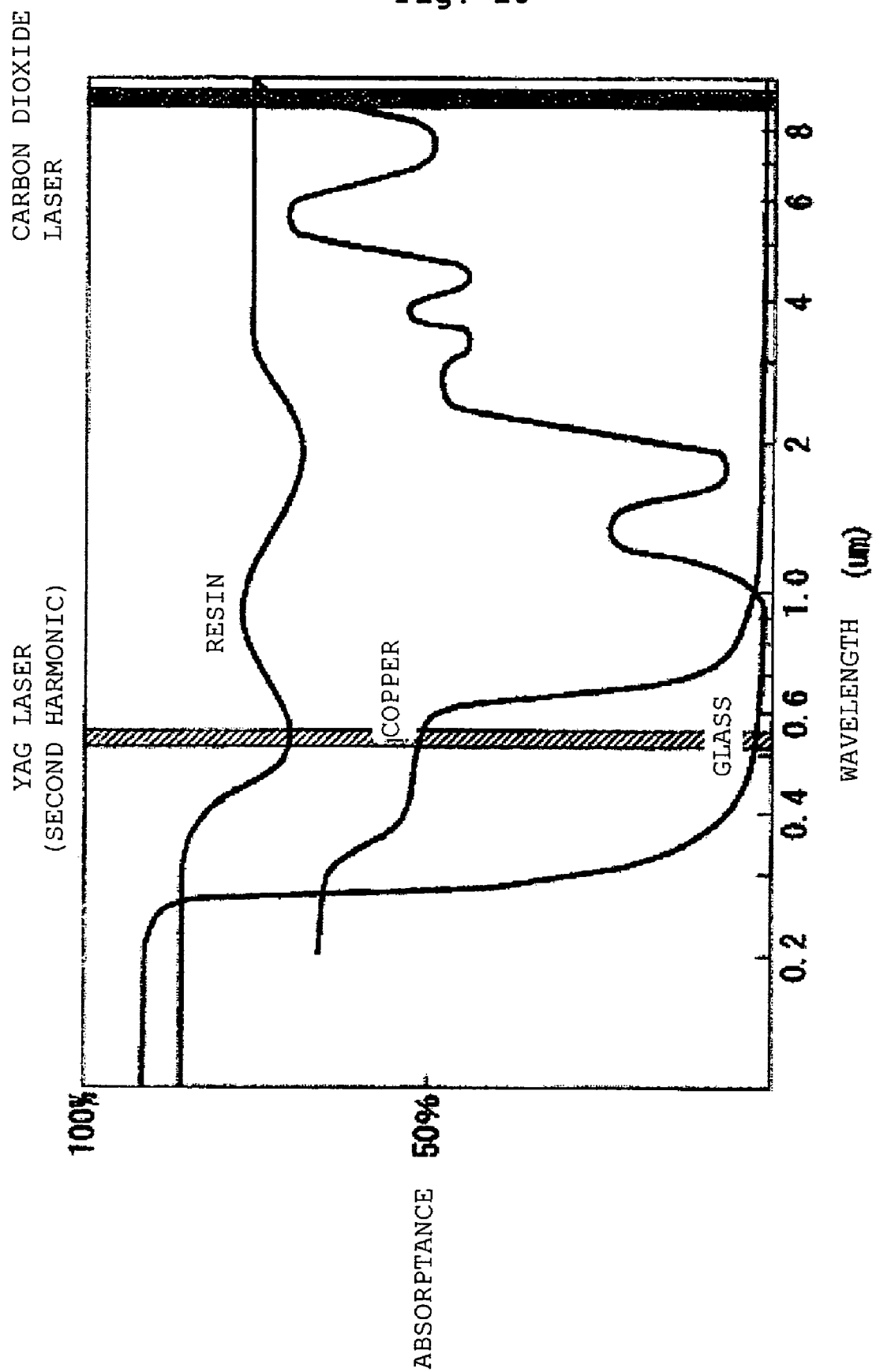
FIG. 10 shows a relationship between a wavelength of a laser and absorptance of the laser for each material.

FIG. 10 shows a relationship between a wavelength of a laser and absorptance of the laser for each material. As shown in FIG. 10, resin and glass have high absorptance of the carbon dioxide laser and are evaporated by being irradiated with the carbon dioxide laser. Meanwhile, copper has low absorptance of the carbon dioxide laser. Thus, even if copper is irradiated with the carbon dioxide laser, copper reflects the laser and is not affected thereby. In this embodiment, the property described above is utilized and the fourth substrate 910, the second substrate 140 and/or the clad 120b can be selectively removed by use of the carbon dioxide laser in the opening formation step shown in FIG. 5(c) and FIG. 9(b).

Moreover, as shown in FIG. 10, resin and copper have high absorptance of the second harmonic of the YAG laser and are evaporated by being irradiated with the second harmonic of the YAG laser. Meanwhile, glass has low absorptance of the second harmonic of the YAG laser. Thus, even if glass is irradiated with the second harmonic of the YAG laser, glass is not affected thereby. In this embodiment, the property described above is utilized and the metal films 400 can be selectively removed by use of the second harmonic of the YAG laser in the metal film removal step shown in FIG. 6(a) and FIG. 9(c).

Figure 11:
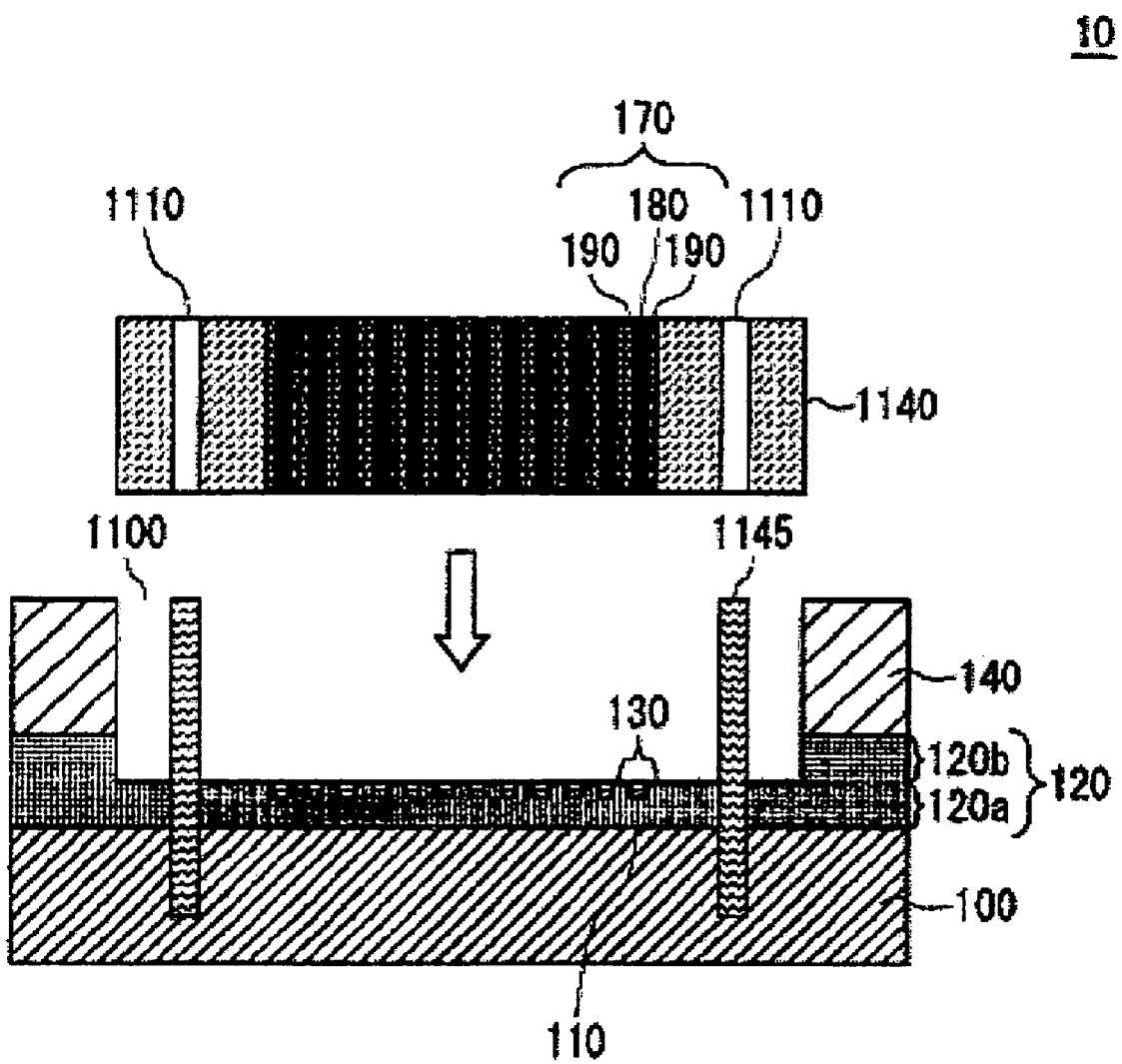
FIG. 11 shows a configuration of an optical transmission substrate 10 according to a second modified example of this embodiment.

FIG. 11 shows a configuration of an optical transmission substrate 10 according to a second modified example of this embodiment. In the optical transmission substrate 10 according to this modified example, a connector 1140 in which a plurality of optical fibers 170 are bundled and fixed is inserted into an opening provided in a position corresponding to ends of a plurality of optical waveguides 130 in an upper surface of the optical transmission substrate 10. Thus, a plurality of cores 110, which are positioned at the ends of the plurality of optical waveguides 130, and the plurality of optical fibers 170 are connected to each other. The members denoted by the same reference numerals as those of FIGS. 1 to 10 in this modified example are similar to the members denoted by the same reference numerals shown in FIGS. 1 to 10. Thus, description thereof will be omitted except for the following differences.

The optical transmission substrate 10 includes: a plurality of optical waveguides 130; an opening 1100 which is provided so as to correspond to the plurality of optical waveguides 130; and a plurality of reflection surfaces 160 which are provided at ends of the plurality of optical waveguides 130 on the opening 1100 side, respectively, so as to correspond to the plurality of optical waveguides 130, respectively. The plurality of optical waveguides 130 according to this embodiment are provided in the same layer in the optical transmission substrate 10 and extend parallel to each other on the upper surface of the first substrate 100. The opening 1100 penetrates the second substrate 140 and the clad 120b and expose the respective ends of the plurality of optical waveguides 130 on the upper surface side of the optical transmission substrate 10. Moreover, in the upper surface of the second substrate 140, guide pins 1145 used for alignment of the connector 1140 are provided.

In the connector 1140, the plurality of optical fibers 170 are fixed, which are provided so as to correspond, respectively, to the plurality of optical waveguides 130 exposed in the opening 1100. Accordingly, the connector 1140 is inserted into the opening 1100 penetrating the second substrate 140 so as to allow the guide pins 1145 to be inserted into guide holes 1110. Thereafter, the plurality of optical fibers 170 are aligned with positions receiving light at the ends of the optical waveguides 130 corresponding to the optical fibers 170, respectively, and/or positions receiving light reflected toward the second substrate 140 by the reflection surfaces 160 corresponding to the optical fibers 170, respectively.

At the upper ends of the plurality of optical fibers 170 in the connector 1140, the light emitting part 950 or the light receiving part 960 is arranged, which emits/receives light to/from the optical fibers 170. Instead of the configuration described above, the optical transmission substrate 10 may adopt a configuration in which the plurality of optical fibers 170 extend as a collective cable from the upper ends in the connector 1140.

By use of the connector 1140 according to this modified example, one-dimensional or two-dimensional optical fiber arrays including the plurality of optical fibers 170 can be bundled and inserted into the opening 1100. Thus, accuracy of the alignment can be improved and operation costs required for installation of the optical fibers 170 can be reduced. Particularly, in the case of transmitting parallel signals of electronic devices such as a processor and a memory, a structure is adopted, in which the plurality of optical waveguides 130 are extended parallel to each other and the connector 1140 is inserted into the opening 1100 provided at the ends of the plurality of optical waveguides 130. Thus, it is possible to efficiently realize a structure in which the parallel signals are optically transmitted between the electronic devices.

Figure 12:
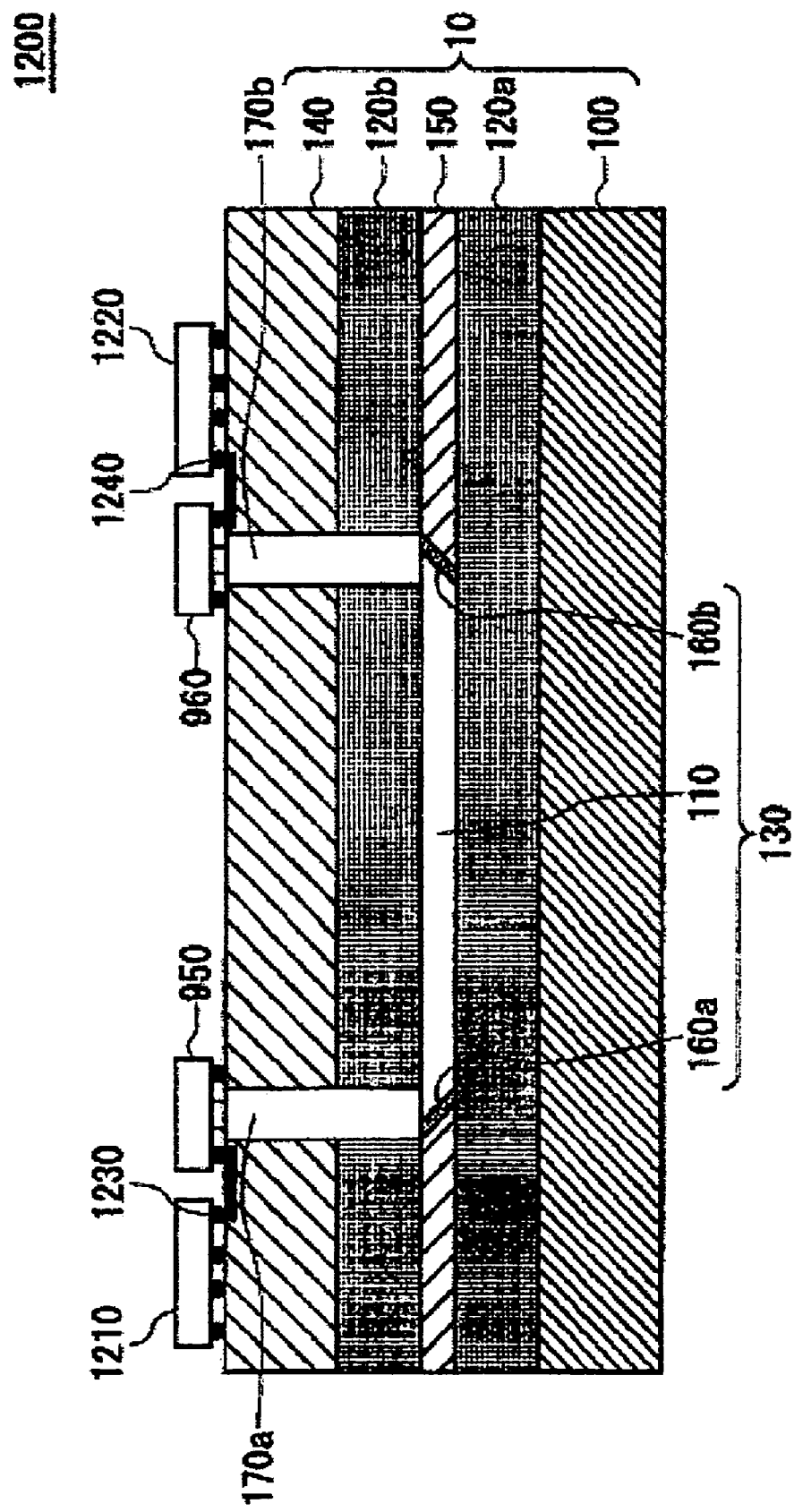
FIG. 12 shows a configuration of an optoelectronic integrated circuit 1200 according to this embodiment.

FIG. 12 shows a configuration of an optoelectronic integrated circuit 1200 according to this embodiment. The optoelectronic integrated circuit 1200 includes an optical transmission substrate 10, a first electronic device 1210, a second electronic device 1220, a light emitting part 950 and a light receiving part 960. The optical transmission substrate 10 is a multilayer substrate having optical transmission lines and adopts a configuration similar to that of the optical transmission substrate 10 shown in FIG. 1. The first and second electronic devices 1210 and 1220 are mounted on the optical transmission substrate 10 and transmit signals by use of an optical transmission line having the optical waveguide 130 shown in FIG. 1, a pair of reflection surfaces 160 provided at both ends of the optical waveguide 130 and optical fibers 170. The light emitting part 950 converts an electric signal outputted from a signal pin 1230 included in the first electronic device 1210 into an optical signal and transmits the optical signal through the optical transmission line. The light receiving part 960 receives the optical signal transmitted through an optical fiber 170*a* on the light emitting part 950 side, the optical waveguide 130 and an optical fiber 170*b* on the light receiving part 960 side, converts the optical signal into an electric signal and inputs the electric signal to a signal pin 1240 included in the second electronic device 1220.

The optical transmission substrate 10 includes the first substrate 100, the optical waveguide 130, the second substrate 140, the reflection surfaces 160*a* and 160*b* and the optical fibers 170*a* and 170*b*. The first substrate 100 may adopt a configuration similar to that of the first substrate 100 shown in FIG. 1. The optical waveguide 130 includes clads 120*a* and 120*b* covering the core 110 and the periphery of the core 110 and extends on the upper surface of the first substrate 100. The second substrate 140 is provided parallel to the first substrate 100 so that the lower surface thereof contacts the upper surface of the optical waveguide 130. The optical fiber 170*a* is provided in the second substrate 140 and guides the optical signal, which is inputted from the light emitting part 950, to a position closer to the core 110 than the upper surface of the clad 120*b*. The reflection surface 160*a* is provided on a cross section of the core 110 at a first end of the optical waveguide 130. The reflection surface 160*a* reflects the optical signal guided from the upper surface of the second substrate 140 by the optical fiber 170*a* and transmits the optical signal through the core 110 of the optical waveguide 130. The reflection surface 160*b* is provided on a cross section of the core 110 at a second end of the optical waveguide 130 and reflects the optical signal, which travels through the core 110 of the optical waveguide 130, toward the second substrate 140. The optical fiber 170*b* is provided in the second substrate 140 and guides the optical signal reflected toward the second substrate 140 to the light receiving part 960 from the position closer to the core 110 than the upper surface of the clad 120*b*.

According to the optoelectronic integrated circuit 1200 described above, the first and second electronic devices 1210 and 1220 can be optically connected with each other. In addition, signal transmission can be performed at a faster speed and with a lower latency than the case where the electronic devices are connected by electric interconnect.

Although the embodiments of the present invention have been described above, a technical range of the present invention is not limited to the range described in the embodiments described above. It is apparent to those skilled in the art that various changes and modifications can be added to the embodiments described above. It is apparent from description of scope of claims that embodiments to which such changes and modifications are added can be also included in the technical range of the present invention.

For example, instead of the reflection part formation step described above, the reflection surface 160 can be also formed by performing the following process. First, polysilane A to be the clad 120 of the optical waveguide 130 is applied onto the first substrate 100 by spin coating or the like. Next, in order to form a component to be the reflection surface 160, polysilane B having the same thickness as the core 110 of the optical waveguide 130 is applied.

Next, on an upper surface of the polysilane B layer, a photoresist pattern is formed, in which exposure of a tilted portion 155 that is a portion to be the reflection surface 160 is gradually changed. By use of this photoresist pattern, an amount of light irradiated on the polysilane B in exposure coincides with a tilt of the reflection surface 160. Therefore, more polysilane B is etched in a region exposed to more light and a film thickness closer to the original thickness of the polysilane B is maintained in a region exposed to less light. Thus, by properly controlling in-plane distribution of irradiation by use of a photomask, a structure of the polysilane B tilted at 45 degrees can be formed.

Next, by use of a photoresist mask in which the tilted portion 155 is exposed, aluminum or silver is evaporated to form the reflection surface 160. On the clad layer on one side of the optical waveguide 130 and the first substrate 100 on which the reflection surface 160 is formed, polysilane B to be the core 110 of the optical waveguide 130 is applied. Accordingly, a hole made in the polysilane B to form the reflection surface 160 is closed. Thus, the surface of the first substrate 100 becomes a state of being covered with a smooth film of polysilane B. Next, a pattern of the core 110 is formed by use of a positive optical resist and a portion other than the core 110 is exposed to ultraviolet rays. Since the refractive index is lowered in the portion irradiated with light, the light can be kept in a portion in the vicinity of the core 110 of the optical waveguide 130. By performing the processes described above, the optical transmission substrate 10 becomes a state similar to that shown in FIGS. 4(*a*) and 4(*b*), in which the core 110 of the optical waveguide 130 and the clad 120 have the same height and the reflection surface 160 also has the same height. Therefore, by use of the method shown in FIG. 4(*c*) and the subsequent drawings, the optical transmission substrate 10 including the optical waveguide 130 can be manufactured.

By use of the method exemplified above, the reflection surface 160 can be formed by use of a photoresist without using a mold and the optical transmission substrate 10 can be efficiently manufactured.

According to the embodiments described above, an optical transmission substrate, a method for manufacturing an optical transmission substrate and an optoelectronic integrated circuit are realized, all of which will be described in respective items below.

(Item 1) An optical transmission substrate including: a first substrate; an optical waveguide which has clad covering a core and a periphery of the core and extends on an upper surface of the first substrate; a second substrate provided parallel to the first substrate so that a lower surface thereof contacts an upper surface of the optical waveguide; a reflection surface which is provided on a cross section of the core at an end of the optical waveguide and reflects light, which travels through the core of the optical waveguide, toward the second substrate; and a light guide which is provided in the second substrate and guides the light, which is reflected toward the second substrate, toward an upper surface of the second substrate from a position closer to the core than an upper surface of the clad.

(Item 2) The optical transmission substrate according to item 1, wherein the light guide contacts an upper surface of the core at the end of the optical waveguide.

(Item 3) The optical transmission substrate according to item 2, wherein the light guide is bonded to the upper surface of the core at the end of the optical waveguide by use of an optical adhesive.

(Item 4) The optical transmission substrate according to item 1, wherein the clad above the core at the end of the optical waveguide is thinner than the clad above the core in a center portion of the optical waveguide.

(Item 5) The optical transmission substrate according to item 1, wherein the light guide is an optical fiber which has a core part and a clad part and guides light, which is reflected toward the second substrate, toward the upper surface of the second substrate through the core part.

(Item 6) The optical transmission substrate according to item 5, wherein the optical fiber has a circular cross section.

(Item 7) The optical transmission substrate according to item 1, further including: a plurality of the optical waveguides; a plurality of the reflection surfaces and a plurality of the light guides, all of which are provided so as to correspond to the plurality of optical waveguides, respectively; and a connector which has the plurality of light guides fixed thereto, is inserted into an opening penetrating the second substrate and aligns the light guides with positions receiving light reflected toward the second substrate by the reflection surfaces corresponding to the plurality of light guides, respectively.

(Item 8) The optical transmission substrate according to item 7, wherein the plurality of optical waveguides extend parallel to each other on the upper surface of the first substrate.

(Item 9) The optical transmission substrate according to item 1, wherein the reflection surface reflects the light, which travels through the core, toward the second substrate approximately vertically to the second substrate.

(Item 10) A method for manufacturing an optical transmission substrate, including: a lower clad layer formation step of forming a lower clad layer of an optical waveguide on an upper surface of a first substrate; a core formation step of forming a core of the optical waveguide; a metal film formation step of forming a metal film above the core at an end of the optical waveguide; an upper clad layer formation step of forming an upper clad layer above the core in the optical waveguide in a state where the metal film is formed; a substrate lamination step of laminating a second substrate on an upper surface of the upper clad layer; an opening formation step of selectively removing the second substrate laminated on the metal film and forming an opening extending to an upper surface of the metal film from an upper surface of the second substrate; and a metal film removal step of selectively removing the metal film.

(Item 11) The method for manufacturing an optical transmission substrate according to item 10, wherein, in the upper clad layer formation step, the upper clad layer is formed on the core in the optical waveguide and the metal film and, in the opening formation step, the second substrate and the upper clad layer, which are laminated on the metal film, are selectively removed to form the opening.

(Item 12) The method for manufacturing an optical transmission substrate according to item 10, further including a light guide installation step of providing a light guide in the opening, the light guide guiding light, which travels through the core and is reflected toward the second substrate at the end of the optical waveguide, toward the upper surface of the second substrate from a position where the metal film is removed.

(Item 13) The method for manufacturing an optical transmission substrate according to item 12, wherein in the metal film formation step, the metal film is formed on an upper surface of the core at the end of the optical waveguide and, in the light guide installation step, the light guide which contacts the core at the end of the optical waveguide is installed.

(Item 14) The method for manufacturing an optical transmission substrate according to item 13, wherein, in the light guide installation step, the core at the end of the optical waveguide and the light guide are bonded to each other by use of an optical adhesive.

(Item 15) The method for manufacturing an optical transmission substrate according to item 12, further including: a core upper clad layer formation step of forming a core upper clad layer on an upper surface of the core of the optical waveguide before the metal film is formed and after the core of the optical waveguide is formed, wherein, in the metal film formation step, the metal film is formed on an upper surface of the core upper clad layer at the end of the optical waveguide, in the upper clad layer formation step, the upper clad layer is formed on the upper surface of the core upper clad layer in the optical waveguide in a state where the metal film is formed, in the opening formation step, the second substrate and the upper clad layer, which are laminated on the metal film, are selectively removed to form the opening and, in the light guide installation step, the light guide which contacts the core upper clad layer at the end of the optical waveguide is installed.

(Item 16) The method for manufacturing an optical transmission substrate according to item 10, further including a reflection part formation step of forming a reflection part having a reflection surface on an upper surface of the lower clad layer, the reflection surface reflecting light traveling through the core of the optical waveguide toward the second substrate, wherein, in the core formation step, the core of which cross section contacts the reflection surface at the end of the optical waveguide is formed.

(Item 17) The method for manufacturing an optical transmission substrate according to item 10, wherein, in the opening formation step, a laser having a first wavelength is irradiated on the upper surface of the second substrate to form the opening in the second substrate and, in the metal film removal step, a laser having a second wavelength is irradiated on the metal film to remove the metal film.

(Item 18) The method for manufacturing an optical transmission substrate according to item 17, wherein, in the opening formation step, a carbon dioxide laser is irradiated on the upper surface of the second substrate to selectively remove a material of the second substrate and form the opening in the second substrate and, in the metal film removal step, a second harmonic YAG laser is irradiated on the metal film made of copper to remove the metal film.

(Item 19) The method for manufacturing an optical transmission substrate according to item 17, wherein, in the opening formation step, a carbon dioxide laser is irradiated on the upper surface of the second substrate to selectively remove a material of the second substrate and form the opening in the second substrate and, in the metal film removal step, a second harmonic titanium sapphire laser is irradiated on the metal film made of gold to remove the metal film.

(Item 20) The method for manufacturing an optical transmission substrate according to item 10, wherein, in the metal film removal step, a femtosecond laser is irradiated on the metal film to remove the metal film.

(Item 21) The method for manufacturing an optical transmission substrate according to item 10, wherein, in the metal film removal step, the metal film is removed by reactive ion etching.

(Item 22) An optoelectronic integrated circuit including: a multilayer substrate having an optical transmission line; first and second electronic devices which are mounted on the multilayer substrate; a light emitting part which converts an electric signal outputted from a signal pin included in the first electronic device into an optical signal and transmits the optical signal through the optical transmission line; and a light receiving part which receives the optical signal transmitted through the optical transmission line, converts the optical signal into the electric signal and inputs the electric signal to a signal pin included in the second electronic device, wherein the multilayer substrate includes: a first substrate; an optical waveguide which has clad covering a core and a periphery of the core and extends on an upper surface of the first substrate; a second substrate provided parallel to the first substrate so that a lower surface thereof contacts an upper surface of the optical waveguide; a first light guide which is provided in the second substrate and guides an optical signal inputted from the light emitting part to a position closer to the core than an upper surface of the clad; a first reflection surface which is provided on a cross section of the core at a first end of the optical waveguide, reflects the optical signal guided from an upper surface of the second substrate by the first light guide and transmits the optical signal through the core of the optical waveguide; a second reflection surface which is provided on a cross section of the core at a second end of the optical waveguide and reflects the optical signal, which travels through the core of the optical waveguide, toward the second substrate; and a second light guide which is provided in the second substrate and guides the optical signal, which is reflected toward the second substrate, to the light receiving part from the position closer to the core than the upper surface of the clad.

According to the present invention, it is possible to provide an optical/electric mounting substrate with a high coupling efficiency, in which an optical waveguide is unlikely to be damaged, and an optoelectronic integrated circuit using the optical/electric mounting substrate.

Although the preferred embodiments of the present invention have been described in detail, it should be understood that various changes, substitutions and alternations can be made therein without departing from spirit and scope of the inventions as defined by the appended claims.

What is claimed is:

1. An optical transmission substrate comprising:
   a first substrate;
   a plurality of optical waveguides each of which has a core and clad covering a periphery of the core and extends on an upper surface of the first substrate;
   a second substrate provided parallel to the first substrate so that a lower surface thereof contacts an upper surface of the optical waveguides;
   a plurality of reflection surfaces each of which is provided on a cross section of the core at an end of the optical waveguides and reflects light, wherein said light advances through the core of the optical waveguides, toward the second substrate;
   a plurality of light guides positioned in the second substrate, wherein said light guides guide said light, which was reflected toward the second substrate, toward an upper surface of the second substrate from a position closer to the core than an upper surface of the clad; and
   a connector connected to said plurality of light guides, wherein said connector is inserted into an opening penetrating the second substrate, and wherein said connector aligns the light guides with positions receiving light reflected toward the second substrate by the reflection surfaces.

2. The optical transmission substrate according to claim 1, wherein the light guides contact an upper surface of the core at the end of the optical waveguides.

3. The optical transmission substrate according to claim 2, wherein the light guides are bonded to the upper surface of the core at the end of the optical waveguides by use of an optical adhesive.

4. The optical transmission substrate according to claim 1, wherein the clad above the core at the end of the optical waveguides is thinner than the clad above the core in a center portion of the optical waveguides.

5. The optical transmission substrate according to claim 1, wherein the light guides are optical fibers which has a core part and a clad part and guides light, which is reflected toward the second substrate, toward the upper surface of the second substrate through the core part.

6. The optical transmission substrate according to claim 5, wherein the optical fibers have a circular cross section.

7. The optical transmission substrate according to claim 1, wherein the plurality of optical waveguides extend parallel to each other on the upper surface of the first substrate.

8. The optical transmission substrate according to claim 1, wherein the reflection surfaces reflect the light, which travels through the core, toward the second substrate approximately vertically to the second substrate.

9. An optoelectronic integrated circuit comprising: a multilayer substrate having an optical transmission line; first and second electronic devices which are mounted on the multilayer substrate; a light emitting part which converts an electric signal outputted from a signal pin included in the first electronic device into an optical signal and transmits the optical signal through the optical transmission line; and a light receiving part which receives the optical signal transmitted through the optical transmission line, converts the optical signal into the electric signal and inputs the electric signal to a signal pin included in the second electronic device, wherein the multilayer substrate includes
a first substrate,
a plurality of optical waveguides each of which has clad covering a core and a periphery of the core and extends on an upper surface of the first substrate,
a second substrate provided parallel to the first substrate so that a lower surface thereof contacts an upper surface of the optical waveguides,
a first light guide positioned in the second substrate, wherein said first light guide guides an optical signal inputted from the light emitting part to a position closer to the core than an upper surface at the clad,
a first reflection surface which is provided on a cross section of the core at a first end of the optical waveguides, wherein said first reflection surface reflects the optical signal guided from an upper surface of the second substrate by the first light guide and transmits the optical signal through the core of the optical waveguides,
at least one second reflection surface which is provided on a cross section of the core at a second end of the optical waveguides, wherein said second reflection surface reflects the optical signal, wherein the optical signal travels through the core of the optical waveguides, toward the second substrate,
at least one second light guide positioned in the second substrate wherein said second light guide guides the optical signal, wherein the optical signal is reflected toward the second substrate, to the light receiving part from the position closer to the core than the upper surface of the clad, and a connector connected to said first light guide and said second light guide, wherein said connector is inserted into an opening penetrating the second substrate, and wherein said connector aligns said first light guide and said second light guide with positions receiving light reflected toward the second substrate by said first reflection surface and said second reflection surface.

10. An optical transmission substrate comprising:

a first substrate;

a plurality of optical waveguides each of which has a core and clad covering a periphery of the core and extends on an upper surface of the first substrate, wherein the plurality of optical waveguides extend parallel to each other on the upper surface of the first substrate;

a second substrate provided parallel to the first substrate so that a lower surface thereof contacts an upper surface of the optical waveguides;

a plurality of reflection surfaces each of which is provided on a cross section of the core at an end of the optical waveguides and reflects light, wherein said light advances through the core of the optical waveguides, toward the second substrate;

a plurality of light guides positioned in the second substrate, wherein said light guides guide said light, which was reflected toward the second substrate, toward an upper surface of the second substrate from a position closer to the core than an upper surface of the clad; and a connector connected to said plurality of light guides, wherein said connector is inserted into an opening penetrating the second substrate, and wherein said connector aligns the light guides with positions receiving light reflected toward the second substrate by the reflection surfaces.

11. The optical transmission substrate according to claim 10, wherein the light guides contact an upper surface of the core at the end of the optical waveguides.

12. The optical transmission substrate according to claim 11, wherein the light guides are bonded to the upper surface of the core at the end of the optical waveguides by use of an optical adhesive.

13. The optical transmission substrate according to claim 10, wherein the clad above the core at the end of the optical waveguides is thinner than the clad above the core in a center portion of the optical waveguides.

14. The optical transmission substrate according to claim 10, wherein the light guides are optical fibers which has a core part and a clad part and guides light, which is reflected toward the second substrate, toward the upper surface of the second substrate through the core part.

15. The optical transmission substrate according to claim 14, wherein the optical fibers have a circular cross section.

* * * * *